(12) United States Patent
Koike et al.

(10) Patent No.: US 8,932,703 B2
(45) Date of Patent: Jan. 13, 2015

(54) ELECTROSTATIC ADSORBABLE SHEET

(75) Inventors: Hiroshi Koike, Ibaraki (JP); Yuichi Yahagi, Ibaraki (JP)

(73) Assignee: Yupo Corporation, Tokyo (JP)

( * ) Notice: Subject to any disclaimer, the term of this patent is extended or adjusted under 35 U.S.C. 154(b) by 0 days.

(21) Appl. No.: 13/996,314

(22) PCT Filed: Dec. 22, 2011

(86) PCT No.: PCT/JP2011/079893
§ 371 (c)(1),
(2), (4) Date: Jun. 20, 2013

(87) PCT Pub. No.: WO2012/086791
PCT Pub. Date: Jun. 28, 2012

(65) Prior Publication Data
US 2013/0309461 A1 Nov. 21, 2013

(30) Foreign Application Priority Data

Dec. 22, 2010 (JP) ................................ 2010-285648
Dec. 22, 2010 (JP) ................................ 2010-285652

(51) Int. Cl.
| | | |
|---|---|---|
| B41M 5/00 | (2006.01) | |
| B44C 1/17 | (2006.01) | |
| G03G 7/00 | (2006.01) | |
| B32B 7/06 | (2006.01) | |
| B32B 27/08 | (2006.01) | |
| B32B 3/00 | (2006.01) | |
| B32B 27/32 | (2006.01) | |
| B32B 7/00 | (2006.01) | |
| B32B 7/02 | (2006.01) | |
| B32B 27/00 | (2006.01) | |
| G09F 3/04 | (2006.01) | |

(52) U.S. Cl.
CPC . B32B 7/06 (2013.01); B32B 27/08 (2013.01); B32B 3/00 (2013.01); H01L 2924/01003 (2013.01); B32B 27/32 (2013.01); B32B 7/00 (2013.01); B32B 7/02 (2013.01); B32B 27/00 (2013.01); G09F 3/04 (2013.01)
USPC ........ 428/195.1; 428/212; 428/213; 428/354; 428/500; 428/688

(58) Field of Classification Search
CPC .............. B32B 3/00; B32B 7/00; B32B 7/06; B32B 27/08; B32B 27/32; H01L 2924/01003
USPC ............... 428/195.1, 212, 213, 354, 500, 688
See application file for complete search history.

(56) References Cited

U.S. PATENT DOCUMENTS

| | | |
|---|---|---|
| 4,654,546 A | 3/1987 | Kirjavainen |
| 5,759,636 A | 6/1998 | Taylor et al. |
| 5,904,985 A | 5/1999 | Ward et al. |
| 5,955,014 A | 9/1999 | Raukola et al. |
| 5,989,685 A | 11/1999 | Hockaday |
| 6,284,339 B1 | 9/2001 | Floegel et al. |
| 6,852,402 B2 | 2/2005 | Kirjavainen et al. |
| 2003/0087067 A1* | 5/2003 | Bourdelais et al. ........... 428/195 |
| 2009/0130309 A1 | 5/2009 | Kawakami et al. |
| 2011/0143104 A1 | 6/2011 | Koike et al. |

FOREIGN PATENT DOCUMENTS

| | | |
|---|---|---|
| JP | 58-098351 | 6/1983 |
| JP | 61-000251 | 1/1986 |
| JP | 63-030940 | 6/1988 |
| JP | 06-083266 | 3/1994 |
| JP | 07-244461 | 9/1995 |
| JP | 9-202040 | 8/1997 |
| JP | 10-504248 | 4/1998 |
| JP | 2005-271217 | 10/2005 |
| JP | 3770926 | 4/2006 |
| JP | 2009-125953 | 6/2009 |
| JP | 2010-023502 | 2/2010 |
| WO | 98/26879 | 6/1998 |
| WO | 2009/154177 | 12/2009 |

OTHER PUBLICATIONS

Search report from E.P.O., mail date is Apr. 16, 2014, Application # 11850063.6.

* cited by examiner

*Primary Examiner* — Betelhem Shewareged
(74) *Attorney, Agent, or Firm* — Greenblum & Bernstein, P.L.C.

(57) ABSTRACT

The present invention provides an electrostatic adsorbable sheet that can attach and display a printed material as it is on an object to be attached, as a poster, an advertisement or the like, has a high electrostatic adsorbability during display use, can be used for display over a long period of time with sufficient durability of the electrostatic adsorbability, has electrostatic adsorbability that is hardly affected by humidity, and can be easily peeled away after display use. In the electrostatic adsorbable sheet, since the electrostatic adsorbability is not exhibited externally before display use, troubles such as blocking of sheets themselves and attachment to a roll particularly in a printing step hardly occur, handlability is good, and the adhesiveness of ink is excellent, so that the sheet is compatible with a variety of printing methods.

22 Claims, 6 Drawing Sheets

ELECTROSTATIC ADSORBABLE SHEET

TECHNICAL FIELD

A label layer (i) constituting the electrostatic adsorbable sheet (iii) of the present invention can be attached to a variety of objects to be attached, as a seal, a label, a sign, a poster, an advertisement, or the like, can be displayed and used over a long period of time, and can be easily peeled away after use.

Also, the present invention relates to a charged electrostatic adsorbable sheet (iii) excellent in recording ability, which has good handlability especially in a printing process, is excellent in ink adhesiveness, and thus is compatible with a variety of printing methods.

BACKGROUND ART

For attaching a poster, an advertisement or the like prepared by printing to a hard object to be attached, such as wall face, glass face, pillar, board, locker, bookshelf or the like, heretofore an adhesive agent, an adhesive tape or the like has been used. Recently, as such a poster, an advertisement or the like, those easily peelable in a reusable state even after use have been desired from the viewpoint of recycling materials. This is because, when they are attached with an adhesive agent or a double-sided adhesive tape, it is not easy to peel away and they are torn and become in a non-reusable state, it becomes difficult to recycle them as resources owing to remaining adhesive agent or pressure-sensitive adhesive agent, and finally there is a problem in that they may become wastes after once used. In addition, when a poster, an advertisement or the like is attached to an object to be attached such as wall face or pillar using an adhesive agent, an adhesive tape, or a double-sided adhesive tape, there arise problems in that the paste may remain after peeling them on the side of the object to be attached and the coating on the surface may peel away.

As a method of posting a poster or an advertisement not using an adhesive agent or an adhesive tape, use of an adsorption-type film that enables attaching by electrostatic force is proposed. For example, Patent References 1 and 2 propose an electrostatic adsorbability-given polyvinyl chloride film; and Patent Reference 3 proposes an electrostatic adsorbability-given polypropylene film.

However, though these films can be substitutes for adhesive agents, adhesive tapes and the like, as lacking in recordability, when they are used as display materials such as posters, they must be used after they are attached to a desired article. In addition, although a specific substance is incorporated in these films for keeping the electrostatic adsorbability, the films still have a defect that the durability thereof is insufficient.

Patent References 4, 5 and 6 propose a porous film composed of an electrostatically-adsorbable polymer. By making the film a porous film, the surface area of the film becomes large and the ability to hold electrified charges is enhanced. However, the porous film is formed according to a coating method, and therefore the polymer usable for it is limited to a polymer soluble in a solvent. In addition, since a polymer having a high moisture permeability is used and the pores formed therein are not closed pores, the film has defects in that the charge-retaining ability thereof varies depending on humidity and the electrostatic adsorbability thereof is also influenced by humidity.

Patent Reference 7 proposes a film that contains flat-shaped pores and has a high unipolar charge given to the inside thereof. The film produced according to the method has an advantage that the electrostatic adsorbability is high and the durability thereof is also high. However, the film has a defect in that, because of its high electrostatic adsorbability, the film may stick to rolls and others at the time of printing at a later stage thereby causing pattern misalignment or may catch dust or the like during printing and may thereby get dirty. Also, as in the cases of the films of Patent References 1 to 3, since the film does not have recordability, it also has a defect of insufficient ink adhesiveness.

Therefore, as disclosed in Patent Reference 8, the present inventors have developed a method of forming a laminate film by laminating a support subjected to antistatic treatment on a resin film having a recording layer through an adhesive agent and subsequently charging the laminate film (subjecting to an electrically charging treatment). However, since the charges imparted by the method are dispersed to both of the resin film and the support, it has been found that the method has a defect in that the electrostatic adsorbability of the resin film is not sufficiently enhanced.

Furthermore, since the films disclosed in Patent References 1 to 8 are all opaque, when they are attached to glass faces such as a window, print or the like cannot be clearly observed through the object to be attached and also viewing is impossible through the places to which the films are attached.

RELATED ART REFERENCES

Patent References

Patent Reference 1: JP-B 63-030940
Patent Reference 2: JP-A 58-098351
Patent Reference 3: JP-A 61-000251
Patent Reference 4: JP-A 06-083266
Patent Reference 5: Japanese Patent No. 3770926
Patent Reference 6: JP-A 07-244461
Patent Reference 7: JP-T 10-504248
Patent Reference 8: JP-A 2010-023502

SUMMARY OF THE INVENTION

Problems that the Invention is to Solve

In view of the above related arts, an object of the present invention is to provide an electrostatic adsorbable sheet, which can attach and display a printed material as it is on an object to be attached as a poster, an advertisement or the like, has a high electrostatic adsorbability during display use, can be used for display over a long period of time with sufficient durability of the electrostatic adsorbability, has electrostatic adsorbability that is not easily affected by humidity, and can be easily peeled off after use and also which is compatible with a variety of printing methods since troubles such as blocking of sheets themselves and attachment to a roll particularly in a printing process hardly occur, handlability is good, and the ink adhesiveness is excellent, because the electrostatic adsorbability is not exhibited externally before display use.

Means for Solving the Problems

In order to solve the problems, the present inventors have extensively studied and, as a result, have found that an electrostatic adsorbable sheet having the desired properties can be provided by producing a laminate having a specific structure through specific steps, and have completed the present invention.

That is, the present invention includes the following embodiments.

(1). It relates to an electrostatic adsorbable sheet (iii) which is a laminate comprising: a label layer (i) containing a resin film layer (A) and a recording layer (B) on one surface of the resin film layer (A); and a support layer (ii), wherein at least one of the label layer (i) and the support layer (ii) is subjected to an electrically charging treatment, the resin film layer (A) and the support layer (ii) are electrostatically adsorbed, the surface resistivity of the label layer (i) side is from $1 \times 10^{-1}$ Ω to $9 \times 10^{12}$ Ω, and the surface resistivity of the support layer (ii) side is from $1 \times 10^{-1}$ Ω to $9 \times 10^{12}$ Ω.

(2). It relates to the electrostatic adsorbable sheet (iii) described in (1) above, wherein the label layer (i) is subjected to an electrically charging treatment.

(3). Also, it relates to the electrostatic adsorbable sheet (iii) described in (1) above, wherein the support layer (ii) is subjected to an electrically charging treatment.

(4). It is preferable that the surface resistivity of the surface of the resin film layer (A) side of the label layer (i) is from $1 \times 10^{13}$ Ω to $9 \times 10^{17}$ Ω, and the surface resistivity of the surface of the support layer (ii), which comes into contact with the resin film layer (A), is from $1 \times 10^{13}$ Ω to $9 \times 10^{17}$ Ω.

(5). It is preferable that the electrically charging treatment is a direct-current corona discharge treatment.

(6). It is preferable that the resin film layer (A) contains a thermoplastic resin.

(7). It is preferable that the thermoplastic resin contains a polyolefin resin.

(8). It is preferable that the resin film layer (A) contains a stretched resin film layer stretched in at least one axial direction.

(9). It is preferable that the resin film layer (A) has a porosity of from 5 to 60% or a porosity of 0% or more and less than 5%.

(10). It is preferable that the recording layer (B) contains a polymer having an antistatic function.

(11). It is preferable that the polymer having an antistatic function in the recording layer (B) contains at least one of a quaternary ammonium salt-type copolymer and an alkali metal salt-containing polymer.

(12). It is preferable that the recording layer (B) contains an alkali metal ion in an amount of from 0.01 to 1% by weight.

(13). It is preferable that the alkali metal ion contains a lithium ion.

(14). It is preferable that the Gurley stiffness of the label layer (i) is from 5 to 1,000 mgf.

(15). It is preferable that the water vapor permeation coefficient of the label layer (i) is from 0.01 to 2.50 g·mm/(m²·24 hr).

(16). It is preferable that the support layer (ii) contains a thermoplastic resin.

(17). It is preferable that the relative dielectric constant of the support layer (ii) is from 1.1 to 5.0.

(18). It is preferable that the thickness of the label layer (i) is from 20 to 500 μm, and the thickness of the support layer (ii) is from 20 to 500 μm.

(19). It is preferable that the label layer (i) has an opacity of from 50 to 100% or an opacity of 0% or more and less than 50%.

(20). Also, the present invention includes a recorded material obtained by printing on the surface of the recording layer (B) side of the electrostatic adsorbable sheet (iii) described in any one of (1) to (19) (above.

(21). Further, the present invention includes a display material comprising the label layer (i) which is obtained by peeling the support layer (ii) from the recorded material described in (20) above.

(22). It includes a method for producing the electrostatic adsorbable sheet (iii) described in any one of (1) to (19) above which comprises: subjecting at lest one of the label layer (i) containing the resin film layer (A) having the recording layer (B) on one side and the support layer (ii) to the electrically charging treatment; and subsequently electrostatically adsorbing the resin film layer (A) and the support layer (ii).

(23). It includes a method for producing the electrostatic adsorbable sheet (iii) described in any one of (1) to (19) above which comprises: subjecting the label layer (i) containing the resin film layer (A) having the recording layer (B) on one side to the electrically charging treatment; and subsequently electrostatically adsorbing the support layer (ii) and the resin film layer (A).

(24). It includes a method for producing the electrostatic adsorbable sheet (iii) described in any one of (1) to (19) above which comprises: subjecting the support layer (ii) to the electrically charging treatment; and subsequently electrostatically adsorbing it to the resin film layer (A) of the label layer (i) containing the resin film layer (A) having the recording layer (B) on one side.

Effect of the Invention

The present invention has made it possible to provide an electrostatic adsorbable sheet, which can attach and display a printed material as it is on an object to be attached as a poster, an advertisement or the like, has a high electrostatic adsorbability during display use, can be used for display over a long period of time with sufficient durability of the electrostatic adsorbability, has electrostatic adsorbability that is not easily affected by humidity, and can be easily peeled away after use and also which is compatible with a variety of printing methods since troubles such as blocking of sheets themselves and attachment to a roll particularly in a printing process hardly occur, handlability is good, and the ink adhesiveness is excellent, because the electrostatic adsorbability is not exhibited externally before display use.

EMBODIMENTS FOR CARRYING OUT THE INVENTION

Figure 1:
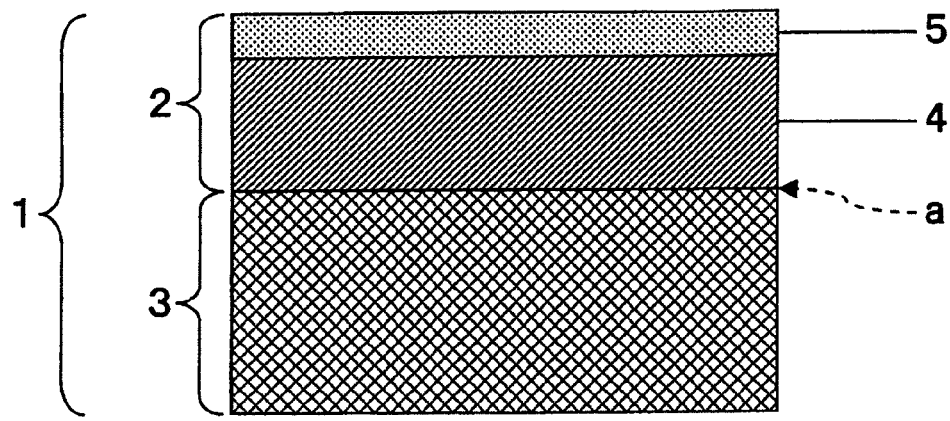
FIG. 1 It is a cross-sectional view of one embodiment of the laminated film of the present invention.
Figure 2:
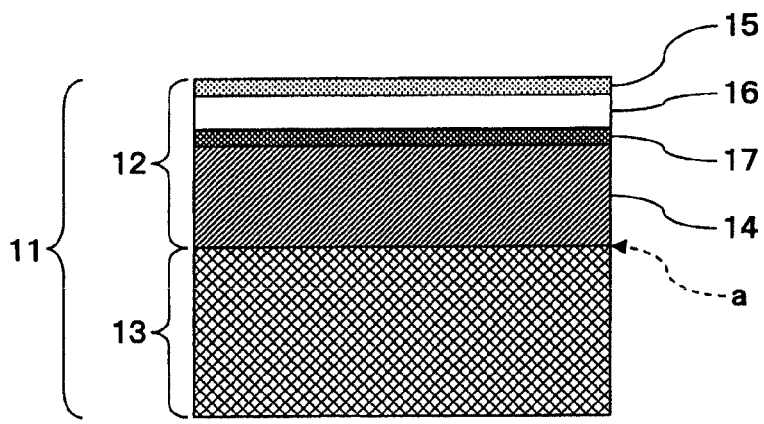
FIG. 2 It is a cross-sectional view of another embodiment of the laminated film of the present invention.
Figure 3:
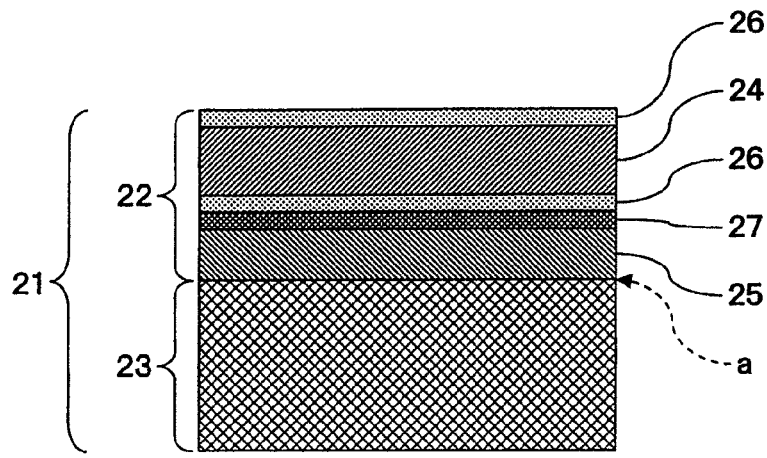
FIG. 3 It is a cross-sectional view of still other embodiment of the laminated film of the present invention.

The electrostatic adsorbable sheet (iii) of the present invention is a laminate comprising a label layer (i) containing a resin film layer (A) and a recording layer (B) on one surface of the resin film layer (A) and a support layer (ii), wherein at least one of the label layer (i) and the support layer (ii) is subjected to an electrically charging treatment, the resin film layer (A) and the support layer (ii) are electrostatically adsorbed, and the both surfaces are difficult to be electrostatically charged but the label layer (i) peeled from the support layer (ii) is electrostatically adsorbable to an object to be attached.

[Label Layer (i)]

The label layer (i) constituting the electrostatic adsorbable sheet (iii) of the present invention can be used as display materials such as a seal, a label, a sign, a poster, and an advertisement. The label layer (i) is characterized in that it can be used for display with attaching it to various objects to be attached, has a high electrostatic adsorbability during display use, can be used for display over a long period of time with sufficient durability of the electrostatic adsorbability, has electrostatic adsorbability that is not easily affected by humidity, and can be easily peeled away after use. The label layer (i) is constituted as one containing the resin film layer (A) having a recording layer (B) on one surface thereof. In this regard, the label layer (i) may be opaque or may be transparent or translucent.

The thickness of the label layer (i) is preferably from 20 to 500 μm, more preferably from 25 to 400 μm, even more preferably from 30 to 200 μm, and particularly preferably from 40 to 150 μm.

When the thickness of the label layer (i) is less than 20 μm, wrinkles easily forms at the time when the label layer (i) is attached to an object to be adhered and thus cannot be attached well, so that its appearance tends to become inferior. To the contrary, when the thickness exceeds 500 μm, the self-weight of the label layer (i) may be large and there is a case where the self-weight cannot be held by the electrostatic adsorbability and the layer may drop from the object to be attached.

[Resin Film Layer (A)]

The resin film layer (A) in the present invention constitutes the label layer (i) and holds charge inside thereof through an electrically charging treatment, and enables the label layer (i) as a display material to attach to an object to be attached by the electrostatic adsorbability.

The resin film layer (A) of the present invention preferably contains a thermoplastic resin. Particularly, by using a thermoplastic resin excellent in insulation, charges accumulated inside it are easily kept and thus the use is preferred.

The type of the thermoplastic resin for use in the resin film layer (A) is not particularly limited. For example, usable are polyolefin resins such as high-density polyethylene, middle-density polyethylene, low-density polyethylene, propylene resins, polymethyl-1-pentene; polyolefin resins having a functional group such as ethylene/vinyl acetate copolymer, ethylene/acrylic acid copolymer, maleic acid-modified polyethylene, maleic acid-modified polypropylene; polyamide resins such as nylon-6, nylon-6,6; thermoplastic polyester resins such as polyethylene terephthalate and copolymers thereof, polybutylene terephthalate, aliphatic polyesters; polycarbonates, atactic polystyrene, syndiotactic polystyrene, and the like. Of those thermoplastic resins, it is preferred to use polyolefin resins and polyolefin resins having a functional group excellent in insulation and workability.

More specific examples of the polyolefin resins include homopolymers of olefins such as ethylene, propylene, butylene, hexene, butadiene, isoprene, chloroprene, methyl-1-pentene; and copolymers of two or more such olefins.

More specific examples of the polyolefin resins having a functional group include copolymers of the aforementioned olefin and a copolymerizable monomer having a functional group. Especially typically, the monomer having a functional group includes styrenes such as styrene, β-methylstyrene; vinyl carboxylates such as vinyl acetate, vinyl alcohol, vinyl propionate, vinyl butyrate, vinyl pivalate, vinyl caproate, vinyl laurate, vinyl stearate, vinyl benzoate, vinyl butylbenzoate, vinyl cyclohexanecarboxylate; acrylic acid, methacrylic acid; (meth)acrylates such as methyl (meth)acrylate, ethyl (meth)acrylate, butyl (meth)acrylate, hexyl (meth)acrylate, octyl (meth)acrylate, 2-ethylhexyl (meth)acrylate, stearyl (meth)acrylate, benzyl (meth)acrylate, cyclohexyl (meth)acrylate, isobonyl (meth)acrylate, dicyclopentanyl (meth)acrylate; (meth)acrylamide, N-methanol (meth)acrylamide; vinyl ethers such as methyl vinyl ether, ethyl vinyl ether, propyl vinyl ether, butyl vinyl ether, cyclopentyl vinyl ether, cyclohexyl vinyl ether, benzyl vinyl ether, phenyl vinyl ether. If desired, one or more of those monomers having a functional group may be suitably selected and copolymerized for use herein.

Furthermore, if desired, these polyolefin resins or polyolefin resins having a functional group may be graft-modified for use herein.

Any known method may be employed for graft modification. One specific example is graft modification with an unsaturated carboxylic acid or its derivative. The unsaturated carboxylic acid includes, for example, acrylic acid, methacrylic acid, maleic acid, fumaric acid, itaconic acid, and the like. As derivatives of the unsaturated carboxylic acids, also usable are their acid anhydrides, esters, amides, imides, metal salts, and the like. Concretely, there are mentioned maleic anhydride, itaconic anhydride, citraconic anhydride, methyl (meth)acrylate, ethyl(meth)acrylate, butyl (meth)acrylate, glycidyl(meth)acrylate, monoethyl maleate, diethyl maleate, monomethyl fumarate, dimethyl fumarate, monomethyl itaconate, diethyl itaconate, (meth)acrylamide, maleic monoamide, maleic diamide, maleic-N-monoethylamide, maleic-N,N-diethylamide, maleic-N-monobutylamide, maleic-N,N-dibutylamide, fumaric monoamide, fumaric diamide, fumaric-N-monoethylamide, fumaric-N,N-diethylamide, fumaric-N-monobutylamide, fumaric-N,N-dibutylamide, maleimide, N-butylmaleimide, N-phenylmaleimide, sodium (meth)acylate, potassium(meth)acrylate, and the like. Graft-modified derivatives are those produced by generally from 0.005 to 10% by weight, preferably from 0.01 to 5% by weight graft-modifying a polyolefin resin or a polyolefin resin having a functional group with a graft monomer.

As the thermoplastic resin for the resin film layer (A), one may be selected from the aforementioned thermoplastic resins for single use thereof, or two or more may be selected from them for combined use thereof.

Further, of those polyolefin resins, preferred are propylene resins from the viewpoint of insulation, workability, chemical resistance, costs and the like. As the propylene resins, propylene homopolymers of isotactic or syndiotactic polypropylene, or those having a different degree of stereoregulality, or copolymers comprising propylene as the main ingredient and copolymerized with an α-olefin such as ethylene, 1-butene, 1-hexene, 1-heptene, 4-methyl-1-pentene or the like are preferably used as the main ingredient. The copolymers may be binary ones or ternary or polynary ones, or may be random copolymers or block copolymers. Preferably, the propylene resin contains, as incorporated therein, a resin having a lower melting point than a propylene homopolymer in an amount of from 2 to 25% by weight. Examples of the resin having a lower melting point may include high-density or low-density polyethylene.

The amount of the thermoplastic resin to be blended in the resin film layer (A) is preferably from 50 to 100% by weight and more preferably from 60 to 100% by weight as total amount. When the amount to be blended is 50% by weight or more, the resin film layer (A) is easily formed and charges are easily kept in the thermoplastic resin in the resulting resin film layer (A).

To the thermoplastic resin to be used for the resin film layer (A) of the present invention, at least one of an inorganic fine powder and an organic filler may be added. There is a case where dielectric constant of the resin film layer (A) can be improved by adding an inorganic fine powder and/or an organic filler. Also, the addition of an inorganic fine powder and/or an organic filler and the stretching step to be mentioned below facilitates formation of pores inside the resin film layer (A).

In the case where an inorganic fine powder is added, those generally having an average particle size of from 0.01 to 15 µm, preferably from 0.1 to 5 µm, which is measured on a particle size analyzer by laser diffraction, are used. Concretely, usable are calcium carbonate, calcined clay, silica, diatomaceous earth, white clay, talc, titanium oxide, barium sulfate, alumina, zeolite, mica, sericite, bentonite, sepiolite, vermiculite, dolomite, wollastonite, glass fibers, and the like.

In the case where an organic filler is added, preferably, a resin different from the thermoplastic resin of the main ingredient of the rein film layer (A) is selected. For example, in the case where the thermoplastic resin is a polyolefin resin, polymers such as polyethylene terephthalate, polybutylene terephthalate, polycarbonate, nylon-6, nylon-6,6, cyclic olefin, polystyrene, polymethacrylate and the like, having a melting point (for example, 170 to 300° C.) or a glass transition temperature (for example, 170 to 280° C.) higher than the melting point of the polyolefin resin and immiscible with the polyolefin resin are usable as the organic filler.

If desired, to the resin film layer (A), a thermal stabilizer (antioxidant), a light stabilizer, a dispersant, a lubricant, and the like may be added. In the case where a thermal stabilizer is added, it is generally added in an amount within a range of from 0.001 to 1% by weight. Concretely, sterically-hindered phenol-type, phosphorus-type, or amine-type stabilizers may be used. In the case where a light stabilizer is used, it is generally used in an amount within a range of from 0.001 to 1% by weight. Concretely, sterically-hindered amine-type, benzotriazole-type or benzophenone-type light stabilizers may be used. A dispersant and a lubricant are used, for example, for the purpose of dispersing an inorganic fine powder. Its amount to be used may be generally within a range of from 0.01 to 4% by weight. Concretely, silane coupling agents; higher fatty acids such as oleic acid, stearic acid; metal soap; polyacrylic acid, polymethacrylic acid or salts thereof, and the like, may be used.

The thickness of the resin film layer (A) is preferably in a range of from 20 to 500 µm, more preferably from 30 to 400 µm, and further preferably from 40 to 300 µm. When the thickness is thinner than 20 µm, the workability of the resin film layer (A) may worsen in handling it by itself, since the layer may take charge and attach to a hand or the like. In some cases, in addition, the layer may easily shrink when attached to an object to be attached and its appearance may be thereby worsened. When the thickness exceeds 500 µm, the self-weight of the resin film layer (A) may become large and, in some cases, the layer could not hold its self-weight by electrostatic force and drops from the object to be attached.

[Multilayer Formation]

The resin film layer (A) may have a two-layer structure or a three-layer or multilayer structure; and the multilayer structure may be stretched in a mode of monoaxial/monoaxial, monoaxial/biaxial, biaxial/monoaxial, monoaxial/monoaxial/biaxial, monoaxial/biaxial/monoaxial, biaxial/monoaxial/monoaxial, monoaxial/biaxial/biaxial, biaxial/biaxial/monoaxial or biaxial/biaxial/biaxial stretching. Such layer multiplication of the resin film layer (A) enables improvement in voltage endurance and addition of various functions such as writability, friction resistance, secondary workability, or the like.

In the case where the resin film layer (A) is formed to have a multilayer structure, various known methods may be employed. Concretely, there are mentioned a multilayer die method of using a feed block and a multi-manifold; an extrusion lamination method using plural dies, and the like. The multilayer die method and the extrusion lamination method may be used in combination.

The resin film layer (A) may be one obtained by multilayer formation through lamination of a layer composed of the other material. The layer composed of the other material may be, for example, another thermoplastic resin film or one containing another recording layer (B) or an adhesive layer. They may be laminated by usual methods such as coating, dry lamination, and melt lamination.

[Stretching]

The resin film layer (A) preferably contains a stretched resin film layer stretched in at least one axial direction. The stretching of the resin film layer can be performed according to any of various known methods generally used.

The stretching temperature may fall within a known temperature range suitable for the thermoplastic resin mainly used for the resin film layer (A), which is within a range from the glass transition temperature of the thermoplastic resin to the melting point of the crystal part thereof. Concretely, in the case where the thermoplastic resin of the resin film layer (A) is a propylene homopolymer (melting point: 155 to 167° C.), the stretching temperature may be from 100 to 166° C., and where the resin is a high-density polyethylene (melting point: 121 to 136° C.), the temperature may be from 70 to 135° C.; or that is, the stretching temperature may be lower by from 1 to 70° C. than the melting point of the resin. Preferably, the stretching speed is from 20 to 350 msec.

The stretching method includes longitudinal stretching based on the peripheral speed difference between rolls, lateral stretching with a tenter oven, sequential biaxial stretching with longitudinal stretching and lateral stretching as combined, rolling, simultaneous biaxial stretching with a tenter oven and a linear motor as combined, simultaneous biaxial stretching with a tenter oven and a pantagraph as combined, and the like. In addition, the stretching method for an inflation film includes simultaneous biaxial stretching according to a tubular method.

The stretching ratio is not particularly limited and may be suitably determined in consideration of the properties of the thermoplastic resin used in the resin film layer (A) and the like. For example, in the case where a propylene homopolymer or copolymer is used as the thermoplastic resin and when stretched in one direction, the stretching ratio may be from about 1.2 to 12 times, preferably from 2 to 10 times, and when stretched biaxially, the areal stretching ratio may be from 1.5 to 60 times, preferably from 4 to 50 times. In the case where any other thermoplastic resin is used and when stretched in one direction, the stretching ratio may be from 1.2 to 10 times, preferably from 2 to 5 times, and when stretched biaxially, the areal stretching ratio may be from 1.5 to 20 times, preferably from 4 to 12 times.

In one embodiment of the present invention, preferably, the resin film layer (A) thus produced has a porosity of from 5 to 60%, more preferably from 10 to 45%, as calculated according to the following formula (I). Having a lot of fine pores inside the film, the number of interfaces in the resin film may increase and the film could hold charges with ease inside it, and the ability of the film to accumulate charges inside it is enhanced, so that the adsorbability thereof lowers little even in a high-humidity environment. In addition, owing to an effect of improving light diffusivity caused by the pores, the resin film layer (A) becomes highly opaque.

In another embodiment of the present invention, the resin film layer (A) obtained as mentioned above has a porosity, as calculated according to the following formula (I), of preferably 0% or more and less than 5%, more preferably from 0 to 3%. When the porosity is less than 5%, the light diffusivity by the pores is little and the resin film layer (A) becomes transparent or translucent.

[Numeral Formula 1]

$$\text{Porosity}(\%) = [(\rho_o - \rho)/\rho_o] \times 100 \quad (1)$$

wherein $\rho_o$ represents true density of the resin film layer (A) and $\rho$ represents density of the resin film layer (A).

The surface resistivity of the resin film layer (A) surface, on which the recording layer (B) is not provided (i.e., the surface resistivity of the label layer (i) side of the electrostatic adsorbable sheet (iii)) is preferably in a range of from $1 \times 10^{13} \Omega$ to $9 \times 10^{17} \Omega$. The surface resistivity is more preferably in a range of from $5 \times 10^{13} \Omega$ to $9 \times 10^{16} \Omega$, further preferably in a range of from $1 \times 10^{14} \Omega$ to $9 \times 10^{15} \Omega$. When the surface resistivity is less than $1 \times 10^{13} \Omega$, charges are escaped along the surface at the time of the electrically charging treatment to be mentioned later, so that the efficiency of injecting charges into the label layer (i) decreases to need excessive energy for the electrically charging treatment or the effect of the electrically charging treatment is not obtained to result in a low electrostatic adsorption performance. On the other hand, when the surface resistivity exceeds $9 \times 10^{17} \Omega$, no problem arises as a function of the label layer (i) but it is difficult to form such a highly insulating surface using a currently known material and, if it is possible to realize it, it is not practical owing to high costs.

The control of the surface resistivity of the resin film layer (A) surface, on which the recording layer (B) is not provided, to a desired range can be achieved by using a polyolefin resin excellent in insulation as the thermoplastic resin or by adjusting the kind and amount of the inorganic fine powder to be blended therewith.

In this regard, in the case where the label layer (i) contains a plurality of resin film layers (A), the surface resistivity of at least a side which is electrostatically adsorbed to the support layer (ii) preferably falls within the above range.

[Recording Layer (B)]

The label layer (i) constituting the electrostatic adsorbable sheet (iii) of the present invention is one in which a recording layer (B) is provided on one surface of the resin film layer (A) mentioned above.

The recording layer (B) in the present invention made troubles in a printing process hardly occurs and improves handling properties by imparting antistatic performance to the label layer (i) and also enhances the adhesiveness of the label layer (i) to printing ink to improve the recordability. As a result, the electrostatic adsorbable sheet (iii) of the present invention is compatible with a variety of printing methods.

Due to the recording layer (B) having the antistatic performance, the surface of the recording layer (B) of the label layer (i) has a low electrostatic adsorbability and the electrostatic adsorptive performance is difficult to exhibit in the state of the electrostatic adsorbable sheet (iii) even in the case where the resin film layer (A) has charges inside it. Therefore, the electrostatic adsorbable sheet (iii) hardly causes troubles such as sticking to rolls and blocking the sheets themselves during a printing process.

The recording layer (B) preferably contains 0.1 to 100% by weight of an antistatic agent, 0 to 99.9% by weight of a polymer binder, and 0 to 70% by weight of pigment particles, more preferably contains 0.5 to 70% by weight of an antistatic agent, 30 to 99.5% by weight of a polymer binder, and 0 to 60% by weight of pigment particles, and still more preferably contains 1 to 50% by weight of an antistatic agent, 50 to 99% by weight of a polymer binder, and 0 to 50% by weight of pigment particles.

The recording layer (B) is preferably formed by providing it as a coated layer containing these ingredients through direct application on the resin film layer (A) or by forming the recording layer (B) on another film beforehand and laminating the layer to the resin film layer (A).

The antistatic agent is added for imparting antistatic performance to the recording layer (B) and examples thereof include low-molecular-weight organic compound-based antistatic agents represented by stearic acid monoglyceride, alkyldiethanolamine, sorbitan monolaurate, alkylbenzenesulfonate, alkyldipenyl ether sulfonate and the like; conductive inorganic fillers represented by ITO (indium-doped tin oxide), ATO (antimony-doped tin oxide), graphite whisker, and the like; so-called electron conductive polymers exhibiting conductivity with $\pi$ electrons in molecular chains, such as polythiophene, polypyrrole, and polyaniline; polymers having antistatic function represented by non-ionic polymer antistatic agents such as polyethylene glycol and polyoxyethylenediamine, quaternary ammonium salt-type copolymers such as polyvinylbenzyltrimethylammonium chloride and polydimethylaminoethyl methacrylate quaternary compounds, alkali metal salt-containing polymers such as alkali metal ion adducts to alkylene oxide group and/or hydroxyl group-containing polymers; and the like.

These antistatic agents individually have characteristics. With regard to the low-molecular-weight organic compound-based antistatic agents, the antistatic performance is remarkably influenced by environmental humidity and a decrease in printing ink transferability and a decrease in ink adhesiveness owing to bleed-out sometimes occur. Since the conductive inorganic fillers do not come into contact therewith when added in a small amount, an antistatic effect is not sufficiently obtained in some cases. Also, since the amount of a binder decreases when the conductive inorganic fillers are added in such an amount that the fillers come into contact therewith, it is sometimes difficult to achieve both of the ink adhesiveness and the antistatic effect. The electron conductive polymers are generally colored black, green or bluish gray owing to coloring derived from the conjugated system and, when they are used, an excellent antistatic effect is obtained but a dull colored label is formed, which is not suitable for use as base paper for printing in some cases.

Since the polymers having antistatic function have little influence on ink adhesiveness and transferability and also cause almost no coloring, they are preferable as polymers having antistatic function for the present invention.

Of these, quaternary ammonium salt-type copolymers and alkali metal salt-containing polymers are more preferable because they have excellent antistatic performance and the influence on the antistatic performance by environmental humidity is little.

[Quaternary Ammonium Salt-Type Copolymers]

As one example of the polymers having antistatic function used in the present invention, a multication-type water-soluble polymer composed of a quaternary ammonium salt-type copolymer may be mentioned. The copolymer is a quaternary ammonium salt-type copolymer containing a quaternary ammonium salt-type monomer structural unit (a) represented by the following general formula (Chemical Formula 1), a hydrophobic monomer structural unit (b) represented by the following general formula (Chemical Formula 6), and a structural unit (c) composed of a monomer copolymerizable therewith and obtained by copolymerizing them in a weight ratio of these structural units ranging (a):(b):(c)=30 to 70:30 to 70:0 to 40 (wt %).

The weight ratio of individual structural units (a), (b) and (c) is preferably 35 to 65:35 to 65:0 to 20 (wt %), particularly preferably 40 to 60:40 to 60:0 to 10 (wt %).

(a) Quaternary Ammonium Salt-Type Monomer Structural Unit

The quaternary ammonium salt-type monomer constituting the structural unit (a) is an ester or amide of acrylic acid or methacrylic acid represented by the following general formula (Chemical Formula 1). The unit is a component contributing the antistatic function of the polymer having antistatic function by the action of two or more cations in the structure. When the ratio of the component in the polymer is less than 30% by weight, a sufficient antistatic effect cannot be imparted. When the ratio exceeds 70% by weight, the polymer becomes exceedingly water-soluble, which causes stickiness under high humidity conditions.

[Chemical Formula 1]

(Chemical Formula 1)

Structural Unit (a)

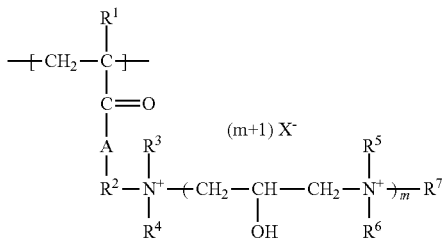

In the above formula, A is an oxo group (—O—) or a secondary amine group (—NH—), $R^1$ is a hydrogen atom or a methyl group, $R^2$ is an alkylene group having 2 to 4 carbon atoms or a 2-hydroxypropylene group represented by the following general formula (Chemical Formula 2), $R^3$, $R^4$, $R^5$ and $R^6$ represent each an alkyl group having 1 to 3 carbon atoms, $R^7$ represents an alkyl group having 1 to 10 carbon atoms or an aralkyl group having 7 to 10 carbon atoms, X represents a chlorine atom, a bromine atom, or an iodine atom, and m represents an integer of 1 to 3. $R^3$, $R^4$, $R^5$ and $R^6$ may be the same or different.

[Chemical Formula 2]

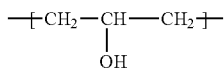

(Chemical Formula 2)

The quaternary ammonium salt-type monomer forming the structural unit (a) represented by the above general formula (Chemical Formula 1) can be obtained by modifying an amine-containing monomer represented by the following general formula (Chemical Formula 3), such as dimethylaminoethyl(meth)acrylate, diethylaminoethyl(meth)acrylate and dimethylaminopropyl(meth)acrylamide with a modifying agent represented by the following general formula (Chemical Formula 5), such as 3-chloro-2-hydroxypropyltrimethylammonium chloride before polymerization or after polymerization.

[Chemical Formula 3]

(Chemical Formula 3)

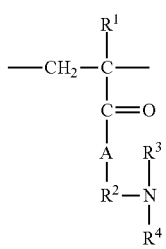

In the above formula, A is an oxo group (—O—) or a secondary amine group (—NH—), $R^1$ is a hydrogen atom or a methyl group, $R^2$ is an alkylene group having 2 to 4 carbon atoms or a 2-hydroxypropylene group represented by the following general formula (Chemical Formula 4), and $R^3$ and $R^4$ represent each an alkyl group having 1 to 3 carbon atoms. $R^3$ and $R^4$ may be the same or different.

[Chemical Formula 4]

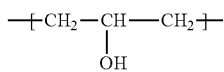

(Chemical Formula 4)

[Chemical Formula 5]

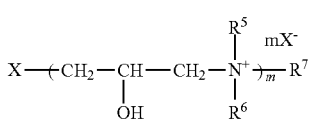

(Chemical Formula 5)

In the above formula (Chemical Formula 5), $R^5$ and $R^6$ represent each an alkyl group having 1 to 3 carbon atoms, $R^7$ represents an alkyl group having 1 to 10 carbon atoms or an aralkyl group having 7 to 10 carbon atoms, X represents a chlorine atom, a bromine atom, or an iodine atom, and m represents an integer of 1 to 3. $R^5$ and $R^6$ may be the same or different.

(b) Hydrophobic Monomer Structural Unit

The hydrophobic monomer structural unit that forms the structural unit (b) is an ester of acrylic acid or methacrylic acid represented by the following general formula (Chemical Formula 6). The unit imparts lipophilicity to the polymer having antistatic function and is an ingredient contributing water resistance and printing ink transferability. In order to achieve both of the printability and the antistatic properties, copolymerization with a hydrophobic monomer is needed. When the ratio of the ingredient in the polymer is less than 30% by weight, the above effect decreases. When the ratio exceeds 70% by weight, the antistatic effect relatively decreases.

[Chemical Formula 6]

Structural Unit (b)

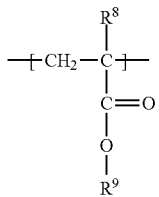

(Chemical Formula 6)

In the above formula, $R^8$ represents a hydrogen atom or a methyl group, $R^9$ represents an alkyl group having 1 to 30 carbon atoms, an aralkyl group having 7 to 22 carbon atoms, or a cycloalkyl group having 5 to 22 carbon atoms.

The monomer forming the structural unit represented by the above general formula (Chemical Formula 6) includes alkyl(meth)acrylates such as methyl (meth)acrylate, ethyl (meth)acrylate, butyl (meth)acrylate, isobutyl(meth)acrylate, tertiary butyl (meth)acrylate, cyclohexyl(meth)acrylate, 2-ethylhexyl(meth)acrylate, laurylyl(meth)acrylate, tridecyl (meth)acrylate, and stearyl(meth)acrylate.

(c) Copolymerizable Other Monomer Structural Unit

Moreover, the other monomer structural unit copolymerizable with the above monomer (a) ingredient and monomer (b) ingredient, which is used according to needs, includes hydrophobic monomers such as styrene, vinyltoluene, and vinyl acetate and hydrophilic monomers such as vinylpyrrolidone and (meth)acrylamides, which are represented by the following general formulae (Chemical Formula 7) to (Chemical Formula 11). These monomers can be preferably incorporated as the structural unit (c) into the quaternary ammonium salt-type copolymers. The unit facilitates the polymerization of the polymer having antistatic function and controls the solubility in a solvent at the preparation of a coating solution.

[Chemical Formula 7]

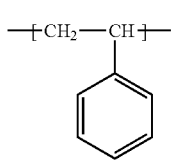

(Chemical Formula 7)

[Chemical Formula 8]

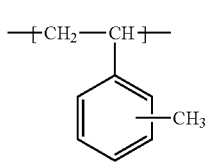

(Chemical Formula 8)

[Chemical Formula 9]

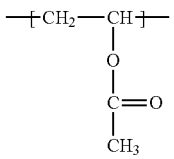

(Chemical Formula 9)

[Chemical Formula 10]

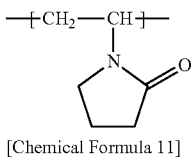

(Chemical Formula 10)

[Chemical Formula 11]

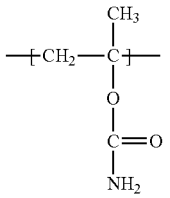

(Chemical Formula 11)

[Copolymerization]

As the copolymerization method for obtaining the above copolymer, known polymerization methods such as bulk polymerization, solution polymerization, and emulsion polymerization using a radical polymerization initiator can be adopted. Of these, a preferable polymerization method is a solution polymerization method and the polymerization is carried out by dissolving individual monomers in a solvent, adding a radical polymerization initiator thereto, and heating and stirring the whole under a nitrogen stream. As the solvent, preferred is water or an alcohol such as methyl alcohol, ethyl alcohol, isopropyl alcohol or cellosolve and these solvents may be used as a mixture. As the polymerization initiator, a peroxide such as benzoyl peroxide or lauroyl peroxide and an azo compound such as azobisisobutyronitrile or azobisvaleronitrile are suitably used. The monomer solid content concentration at polymerization is usually from 10 to 60% by weight and the concentration of the polymerization initiator is usually from 0.1 to 10% by weight based on the monomers. The molecular weight of the quaternary ammonium salt-type copolymer can be controlled to an arbitrary level by polymerization conditions such as polymerization temperature, polymerization time, the kind and amount of the polymerization initiator, the amount of the solvent used, and a chain transfer agent.

With regard to the molecular weight of the quaternary ammonium salt-type copolymer usable in the present invention, weight-average molecular weight measured by gel permeation chromatography (GPC) is generally in a range of from 1,000 to 1,000,000 and is preferably in a range of 1,000 to 500,000.

[Alkali Metal Salt-Containing Polymer]

As another example of the polymer having antistatic function usable in the present invention, the alkali metal salt-containing polymer may be mentioned. The copolymer is an alkali metal salt-containing polymer containing a polyalkylene oxide compound monomer structural unit (d) represented by the following general formula (Chemical Formula 12), a hydrophobic monomer structural unit (b) represented by the above general formula (Chemical Formula 6), and a structural unit (c) composed of a monomer copolymerizable therewith and obtained by copolymerizing them in a weight ratio of these structural units ranging (d):(b):(c)=1 to 99:0 to 99:0 to 40 (wt %).

The weight ratio of the structural units (d), (b) and (c) is preferably 20 to 70:30 to 80:0 to 20 (wt %) and particularly preferably 30 to 60:40 to 70:0 to 10 (wt %).

(d) Polyalkylene Oxide Compound Monomer Structural Unit

The polyalkylene oxide compound monomer forming the structural unit (d) is an ester of acrylic acid or methacrylic acid, represented by the following general formula (Chemical Formula 12). The unit is an ingredient contributing the antistatic function of the polymer (C) by anions and alkali metal ions in the structure. When the ratio of the ingredient in the polymer is less than 1% by weight, a sufficient antistatic effect cannot be imparted. When the ratio exceeds 99% by weight, the polymer becomes exceedingly water-soluble, which causes stickiness under high humidity conditions.

[Chemical Formula 12]

(Chemical Formula 12)

Structural Unit (d)

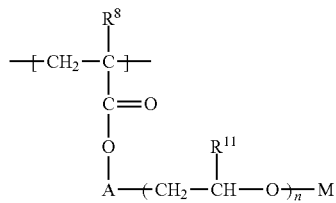

In the above formula, $R^{10}$ represents a hydrogen atom or a methyl group, $R^{11}$ represents a hydrogen atom, a chlorine atom, or a methyl group, A represents one linking group selected from the following <First Group>, a linking group in which one or more linking groups selected from the following <First Group> and one or more linking groups selected from the following <Second Group> are bonded alternatively, or a single bond, M represents an alkali metal ion, and n represents an integer of 1 to 100.

<First Group> alkylene groups having 1 to 6 carbon atoms, which may have a substituent,
   arylene groups having 6 to 20 carbon atoms, which may have a substituent,
<Second Group> —CONH—, —NHCO—, —OCONH—, —NHCOO—, —NH—, —COO—, —OCO—, —O—

The alkylene groups having 1 to 6 carbon atoms in <First Group> includes a methylene group, an ethylene group, a propylene group, a butylene group, a pentylene group, and a hexylene group, which may be linear or branched but is preferably linear. The substituent includes a hydroxyl group, an aryl group, or the like. The arylene groups having 6 to 20 carbon atoms includes a phenylene group, a naphthylene group, an anthrylene group, or the like. The substituent includes a hydroxyl group, an alkyl group, or the like. As an arylene group substituted with an alkyl group, a tolylene group, a xylylene group, or the like. may be mentioned.

Moreover, as the linking group selected from <Second Group>, a urethane group or an ester group can be preferably selected.

As the linking group in which one or more linking groups selected from <First Group> and one or more linking groups selected from <Second Group> are bonded alternatively, for example, a linking group represented by "(linking group selected from First Group)-(linking group selected from Second Group)", a linking group represented by "(linking group selected from First Group)-(linking group selected from Second Group)-(linking group selected from First Group)-(linking group selected from Second Group)", and the like. In the latter case, the two kinds of (linking group selected from First Group) may be the same or different from each other and the two kinds of (linking group selected from Second Group) may be the same or different from each other.

In the above general formula (Chemical Formula 12), when n is 2 or more, n pieces of $R^{11}$ may be the same or different but are preferably the same. n represents an integer of from 1 to 100 but is preferably from 2 to 50 and more preferably from 3 to 50. For example, in the case where $R^{11}$ is a hydrogen atom, n may be selected from a range of from 10 to 35, further from 15 to 30, and still further from 20 to 25 and, in the case where $R^{11}$ is a methyl group, n may be selected from a range of from 1 to 20, further from 3 to 16, and still further from 5 to 14.

In the above general formula (Chemical Formula 12), M is an alkali metal and Li, Na, K, and the like may be mentioned. It is preferred to use Li that has a small ion radius in view of conductivity.

Examples of the polyalkylene oxide compound monomer suitably usable in the present invention include (poly)alkylene oxide(meth)acrylates such as (poly)ethylene glycol (meth)acrylate, (poly)propylene glycol(meth)acrylate, (poly)chloroethylene glycol(meth)acrylate, (poly)tetramethylene glycol(meth)acrylate, methoxy(poly)ethylene glycol(meth)acrylate, and methoxy(poly)propylene glycol(meth)acrylate.

Moreover, in these concrete examples, alkylene oxide monomers further having a linking group other than a single bond at a place corresponding to A of the above general formula (Chemical Formula 12) may be also mentioned. For example, as compounds having a urethane bond at A, those described in JP-A 09-113704 can be used.

The method of introducing an alkali metal corresponding to M is not particularly limited but usually, ionic conductivity with alkali metal ions can be achieved by reacting an alkylene oxide monomer with an alkali metal salt to ionize a terminal of the hydroxyl group. Examples of the alkali metal salt suitably usable in the present invention include perchlorate of lithium, sodium or potassium, or inorganic salts such as chlorides, bromides, iodides, and thiocyanides thereof. By adding these inorganic salts to the above polyalkylene oxide compound monomers to achieve alkoxide formation, ionic conductivity with alkali metal ions can be obtained. Also, JP-A 09-113704 proposes alkoxide compounds having a urethane bond at A of the formula 1.

As the alkali metal ion usable in the present invention, aforementioned lithium ion, sodium ion, and potassium ion can be used but, of these, a lithium ion that has a small ion radius is most suitable. To the recording layer (B) of the present invention, it is desirable to add a polymer having antistatic function so that the concentration of the alkali metal ions is preferably from 0.01 to 1.00% by weight, more preferably from 0.01 to 0.70% by weight, and further preferably from 0.01 to 0.50% by weight. When the concentration of the alkali metal ions is less than 0.01% by weight, a sufficient antistatic effect is not obtained. When the concentration exceeds 1.00% by weight, an antistatic effect is obtained but adhesiveness to printing ink decreases due to an increase in metal ions.

[Copolymerization]

The alkali metal salt-containing polymer usable in the present invention can be produced by copolymerizing the polyalkylene oxide compound monomer structural unit (d) represented by the above general formula (Chemical Formula 12), a hydrophobic monomer structural unit (b) represented by the above general formula (Chemical Formula 6), and a monomer structural unit (c) of the above general formulae (Chemical Formula 7) to (Chemical Formula 11), or the like copolymerizable therewith.

The method for producing the alkali metal salt-containing polymer is not particularly limited and known polymerization methods can be appropriately used singly or in combination. But, as in the case of the quaternary ammonium salt-type copolymer, known polymerization methods such as bulk polymerization, solution polymerization, and emulsion polymerization using a radical initiator are preferably adopted.

Of these, a more preferable polymerization method is a solution polymerization method. Concretely, under a nitrogen stream, the polymerization is carried out by dissolving monomers such as the polyalkylene oxide compound monomer structural unit (d), the hydrophobic monomer structural unit (b), and the copolymerizable monomer structural unit (c) used as raw amterials in an inert organic solvent, for example, n-hexane, n-butanol, 2-propanol, toluene, xylene, methyl ethyl ketone, acetone, methyl isobutyl ketone, cyclohexanone, ethyl acetate, isopropyl acetate, butyl acetate, tetrahydrofuran, ethyl cellosolve, butyl cellosolve, propylene glycol monoethyl ether, or the like, adding a radical polymerization initiator thereto, and subsequently stirring the whole under heating usually at 65 to 150° C. The polymerization time is usually set at 1 to 24 hours. The monomer solid content concentration at polymerization is usually from 10 to 60% by weight and the concentration of the polymerization initiator is usually from 0.1 to 10% by weight based on the monomers. The molecular weight of the alkali metal salt-containing polymer can be controlled to an arbitrary level by polymerization conditions such as polymerization temperature, polymerization time, the kind and amount of the polymerization initiator, the amount of the solvent used, and a chain transfer agent.

The polymerization initiator for used in the copolymerization is preferably oil-soluble and suitable polymerization initiators include organic peroxide, azo nitriles, and the like. The organic peroxides include alkyl peroxides (dialkyl peroxides), aryl peroxides (diaryl peroxides), acyl peroxides (diacyl peroxides), aroyl peroxides (diaroyl peroxides), ketone peroxides, peroxycarbonates (peroxydicarbonates), peroxycarbolates, peroxycarboxylates, hydroperoxides, peroxyketals, peroxyesters, and the like. As the alkyl peroxides, diisopropyl peroxide, di-tert-butyl peroxides, tert-butyl hydroperoxide, and the like may be mentioned. As the aryl peroxides, dicumyl peroxide, cumyl hydroperoxide, and the like may be mentioned. As the acyl peroxides, dilauroyl peroxide and the like may be mentioned. As the aroyl peroxides, dibenzoyl peroxide and the like may be mentioned. As the ketone peroxides, methyl ethyl ketone peroxide, cyclohexanone peroxide, and the like may be mentioned. As the azo nitriles, azobisisobutyronitrile, azobisisopropionitrile, and the like may be mentioned.

With regard to the molecular weight of the alkali metal salt-containing polymer usable in the present invention, weight-average molecular weight measured by gel permeation chromatography (GPC) is preferably in a range of 10,000 to 1,000,000. When the molecular weight is 10,000 or more, the polymer hardly exudes from the formed coated layer, so that a sufficient water resistance tends to be easily obtained. When the molecular weight is 1,000,000 or less, the polymer easily mixes with the binder component, so that coating defects does not easily occur and a uniform antistatic effect tends to be easily obtained.

The recording layer (B) of the present invention may contain a polymer binder according to needs. The polymer binder is appropriately used for the purpose of achieving adhesiveness to the resin film layer (A) on which the recording layer (B) is provided or the other film and improving the adhesiveness to printing ink.

Specific examples of the polymer binder include polyethyleneimine polymers such as polyethyleneimine, polyethyleneimine modified with an alkyl having 1 to 12 carbon atoms, poly(ethyleneimine-urea), ethyleneimine adducts of poly (ethyleneimine-urea), polyaminepolyamides, ethyleneimine adducts of polyaminepolyamides, and epichlorohydrin adducts of polyaminepolyamides; acrylate polymers such as acrylate copolymers, methacrylate copolymers, acrylamide-acrylate copolymers, acrylamide-acrylate-methacrylate copolymers, derivatives of polyacrylamide, and oxazoline group-containing acrylate copolymers; polyvinylpyrrolidone, polyethylene glycol, or the like; and also vinyl acetate resin, urethane resin, polyether resin, polyester resin, urea resin, terpene resin, petroleum resin, ethylene-vinyl acetate copolymers, vinyl chloride resin, vinyl chloride-vinyl acetate copolymer resin, vinylidene chloride resin, vinyl chloride-vinylidene chloride copolymer resin, chlorinated ethylene resin, chlorinated propylene resin, butyral resin, silicone resin, nitrocellulose resin, styrene-acryl copolymer resin, styrene-butadiene copolymer resin, acrylonitrile-butadiene copolymers, and the like.

Any one of these polymer binders may be used or two or more thereof may be used in combination. These polymer binders may be used in a state that they are diluted or dispersed with an organic solvent or water. Of these, a urethane resin such as polyether urethane, polyester urethane or acrylurethane or an acrylate ester copolymer is preferable since they are compatible (mutually soluble) with an aforementioned ionic polymer-based polymer having antistatic function, are stable and easily applied at the time when mixed to form a coating.

The recording layer (B) of the present invention may contain pigment particles according to needs. The recording layer (B) can contain the pigment particles in a range of from 0 to 70% by weight. That is, the layer may contain 70% by weight or less of the pigment particles or may not contain them.

The pigment particles can be suitably selected and used with in consideration of performance impartment such as an improvement in fixity of printing ink owing to its oil absorbability, an improvement in texture and glossiness of surface as an extender, an improvement in whiteness as a white pigment, an improvement in blocking preventive performance by imparting surface unevenness, and an improvement in light resistance and weather resistance as a UV reflector.

As the pigment particles, an organic or inorganic fine powder is used. As concrete examples, silicon oxide, calcium carbonate, baked clay, titanium oxide, zinc oxide, barium sulfate, diatomaceous earth, acrylic particles, styrene particles, polyethylene particles, polypropylene particles, and the like can be used. The particle size of the pigment particles is preferably 20 µm or less, more preferably 15 µm or less. When the particle size of the pigment particles exceeds 20 µm, the pigment particles easily come out from the formed coated layer and a chalky phenomenon is generated. The content of the pigment particles in the recording layer (B) is in a range of preferably from 0 to 70% by weight, more preferably from 0 to 60% by weight, and further preferably from 0 to 45% by weight. When the content of the pigment particles exceeds 70% by weight, the binder resin becomes relatively insufficient and an insufficient cohesive force of the recording layer (B) is generated, so that printing ink tends to peel off.

The method of providing the recording layer (B) on the resin film layer (A) is not particularly limited and it is conducted by a known method for those skilled in the art depending on the kinds of the resin film layer (A) and the recording layer (B) and the like.

For example, the recording layer (B) can be provided as a coated layer by preparing a coating solution containing the above ingredients, applying the solution on the resin film layer (A) or the like, and drying and solidifying it. For coating, conventionally known methods and devices can be utilized.

Also, for example, the recording layer (B) can be provided on the resin film layer (A) by lamination. In this case, another film having the recording layer (B) provided thereon is formed beforehand and it may be laminated on the resin film layer (A). The lamination can be performed by a method such as usual dry lamination or melt-lamination.

The mounting of the recording layer (B) on the resin film layer (A) is preferably conducted before the electrically charging treatment to be mentioned later is carried out. By the antistatic performance of the recording layer (B), the electrostatic adsorbability of the recording layer (B) side of the label layer (i) can be suppressed even after the electrically charging treatment.

In this regard, it is enough that the label layer (i) has the resin film layer (A) on one surface and the recording layer (B) on another surface and may contain a plurality of the same or different resin film layers (A) and a plurality of the same or different recording layers (B).

The recording layer (B) of the present invention has antistatic performance. The surface resistivity of the surface of the recording layer (B) at outer side of the electrostatic adsorbable sheet (iii) (i.e., surface resistivity of the label layer (i) side of the electrostatic adsorbable sheet (iii)) is controlled to a range of from $1\times10^{-1}$ to $9\times10^{12}\Omega$, preferably from $1\times10^3$ to $9\times10^{11}\Omega$, and further preferably from $1\times10^6$ to $9\times10^{10}\Omega$.

When the surface resistivity of the recording layer (B) exceeds $9\times10^{12}\Omega$, the electrostatic adsorbability of the label layer (i) cannot sufficiently be suppressed and there is a case where the electrostatic adsorbable sheet (iii) easily causes troubles such as sticking to rolls or blocking of the sheets themselves during a printing process. On the other hand, in the case where the surface resistivity of the recording layer (B) is less than $1\times10^{-1}\Omega$, there is a concern that the electrostatic adsorbability of the label layer (i) may be impaired and also it is technically difficult to form the recording layer (B) having such a high conductivity and, if it is possible to form it, the case is not practical owing to high costs.

Incidentally, in the case where the label layer (i) contains a plurality of recording layers (B), it is sufficient that the surface resistivity of at least the surface at outer side of the electrostatic adsorbable sheet (iii) falls within the above range.

The film thickness of the recording layer (B) is preferably from 0.01 to 50 μm, more preferably from 0.05 to 30 μm, further preferably from 0.1 to 10 μm, and particularly preferably from 0.3 to 8 μm. When the film thickness is less than 0.01 μm, it is difficult to maintain the homogeneity of the recording layer (B) and there is a possibility that the adhesiveness of printing ink may decrease. On the other hand, when the thickness exceeds 50 μm, the recording layer (B) becomes heavy and the self-weight cannot be held by the electrostatic adsorption force of the resin film layer (A), so that the layer easily peels off and thus the expected performance of the present invention is difficult to achieve.

[Support Layer (ii)]

The support layer (ii) constituting the electrostatic adsorbable sheet (iii) of the present invention is laminated through electrostatic adsorption by subjecting the label layer (i) to an electrically charging treatment to be mentioned later and bringing the support layer into contact with the resin film layer (A) of the label layer (i) having charges accumulated inside it.

Moreover, in the case where the support layer (ii) constituting the electrostatic adsorbable sheet (iii) of the present invention contains a resin film similar to the aforementioned label layer (i), it is also possible to form the electrostatic adsorbable sheet (iii) of the present invention by subjecting the film to an electrically charging treatment to form a support layer (ii) having charges accumulated inside it and bringing the support layer into contact with the resin film layer (A) of the label layer (i) to effect lamination through electrostatic adsorption. On this occasion, since the support layer (ii) contains a recording layer similar to the aforementioned recording layer (B) of the label layer (i), the support layer (ii) can be also used as a display material with attaching it to an object to be attached.

The support layer (ii) enables the electrostatic adsorbable sheet (iii) combined with the label layer (i) to have antistatic performance on its both surfaces by imparting antistatic performance to one surface of the support layer (ii) as in the case of the label layer (i). As a result, the electrostatic adsorbable sheet (iii) as a laminate hardly causes troubles of attachment to surroundings, blocking of the electrostatic adsorbable sheets (iii) themselves, and the like at handling such as transportation, storage, and printing of the electrostatic adsorbable sheet (iii), and thus has excellent handlability, without exhibiting electrostatic adsorbability externally.

Therefore, although the support layer (ii) is removed at the time when the label layer (i) and a display material obtained by performing printing to be mentioned later thereon are used for display similarly to a release paper in a pressure-sensitive adhesive label, in the pre-stage thereof, the support layer (ii) is a layer which is provided for the purpose of facilitating the printing on the electrostatic adsorbable sheet (iii) with protecting the high electrostatic adsorbability of the label layer (i).

As the support layer (ii), one composed of a known material such as paper, synthetic paper, resin film, woven fabric, or non-woven fabric is appropriately selected in consideration of electrostatic adsorption to the label layer (i) and impartment of antistatic performance.

The support layer (ii) may have a single-layer constitution or may be a multilayer constitution composed of two or more layers. As mentioned above, the support layer (ii) is electrostatically adsorbable at one surface coming into contact with the label layer (i) and the opposite surface is constituted so as to have antistatic performance, so that it is preferable to have a multilayer structure.

In the case where the support layer (ii) is made a multilayer structure, the layer may be one obtained by attaching papers having different compositions or resin films having different compositions themselves, or by attaching different two or more kinds of materials such as papers, synthetic papers, and resin films. From the viewpoint of reducing migration of charges from the label layer (i), the surface coming into contact with the label layer (i) is preferably composed of a resin excellent in insulation. Examples of the resin excellent in insulation include polyolefin resins, polyolefin resins having a functional group, polyamide resins, thermoplastic polyester resins, and the like exemplified in the case of the aforementioned label layer (i).

Moreover, by constituting the support layer (ii) by these materials and by subjecting it to processing for forming voids inside the layer, the relative dielectric constant thereof is preferably in a range of from 1.1 to 5.0. It was found that the relative dielectric constant of the support layer (ii) has some influence on the electrostatic adsorbability of the label layer (i) when the label layer (i) and the support layer (ii) are laminated. The relative dielectric constant of the support layer (ii) is preferably from 1.1 to 5.0, more preferably from 1.2 to 4.0, and further preferably from 1.5 to 3.0. When the relative dielectric constant of the support layer (ii) exceeds 5.0, the label layer (i) does not hold charges for a long period of time and the electrostatic adsorbability easily decreases in some cases. On the other hand, the relative dielectric constant of less than 1.1 seems to be no problem in view of performance but, since it is lower than the relative dielectric constant of air (vacuum), such a material is difficult to form by current technology.

Furthermore, from the viewpoint of reducing the migration of charges, it is preferable that the support layer (ii) is constituted by a resin excellent in insulation and the surface resistivity of the surface of the support layer (ii) coming into contact with the label layer (i) (i.e., surface coming into contact with the resin film layer (A)) is in a range of from $1\times10^{13}$ to $9\times10^{17}\Omega$. The surface resistivity is more preferably in a range of from $5\times10^{13}$ to $9\times10^{16}\Omega$, further preferably in a range of from $1\times10^{14}$ to $9\times10^{15}\Omega$. When the surface resistivity is less than $1\times10^{13}\Omega$, the charges of the label layer (i) escape to outside (into the air and the like) along the surface, so that the label layer (i) cannot hold the charges for a long period of time and thus the electrostatic adsorbability easily decreases in some cases. On the other hand, the surface resistivity exceeding $9\times10^{17}\Omega$ seems to be no problem in view of performance but it is difficult to form such a highly insulating surface using a currently known substance and, if it is possible to realize it, it is not practical owing to high costs.

On the other hand, for the purpose of imparting antistatic performance to one surface of the support layer (ii), it is desirable to impart the antistatic performance to the surface to be the outer layer of the electrostatic adsorbable sheet (iii).

For imparting the antistatic performance to the support layer (ii), there may be mentioned a method of providing the same one as the above recording layer (B) used in the label layer (i), a method of providing a conductive layer by applying a conductive coating, a method of providing a metal thin film by direct vapor deposition, transfer vapor deposition, lamination of a deposited film, or the like, a method of kneading an antistatic agent into a resin constituting the support layer (ii), and the like.

By the above methods, the surface resistivity of the surface of the support layer (ii) to be the outer layer of the electrostatic adsorbable sheet (iii) (i.e., surface of the support layer (ii) side of the electrostatic adsorbable sheet (iii)) is in a range of from $1\times10^{-1}$ to $9\times10^{12}\Omega$. The surface resistivity is preferably in a range of from $1\times10^{0}$ to $9\times10^{11}\Omega$.

When the surface resistivity of the support layer (ii) to be the outer layer of the electrostatic adsorbable sheet (iii) exceeds $9\times10^{12}\Omega$, the antistatic performance is not sufficient and troubles such as attachment of the electrostatic adsorbable sheet (iii) to surroundings and blocking of the electrostatic adsorbable sheets (iii) themselves easily occur, so that expected performance of the present invention is not easily obtained. On the other hand, the case where the surface resistivity is less than $1\times10^{-1}\Omega$ seems to be no problem as the electrostatic adsorbable sheet (iii) in view of performance but it is difficult to form such a highly conductive surface using a currently known substance and, if it is possible to realize it, it is not practical owing to high costs.

The thickness of the support layer (ii) is preferably from 20 to 500 μm, more preferably from 25 to 400 μm, further preferably from 30 to 200 μm, and particularly preferably from 35 to 150 μm.

When the thickness of the support layer (ii) is less than 20 μm, the charges flow out through the thickness of the support layer (ii) from the surface to which the label layer (i) is electrostatically adsorbed, so that the charges in the electrostatic adsorbable sheet (iii) are not confined therein and thus the electrostatic adsorbability of the label layer (i) becomes weak in some cases. To the contrary, when the thickness exceeds 500 μm, the resulting electrostatic adsorbable sheet (iii) also becomes thick, which is inferior in workability at a printing process and at a cutting process in some cases.

[Adhesive Layer]

The electrostatic adsorbable sheet (iii) of the present invention may have an adhesive layer provided between the label layer (i) and the support layer (ii) constituting the sheet. Here, in the lamination of the label layer (i) and the support layer (ii), the adhesive layer is provided between them for the purpose of more strongly adhering the both layers, in addition to the electrostatic adsorbability of the label layer (i).

The adhesive layer is preferably constituted so that, at the time when the both layers are peeled from each other, the adhesive agent follows the support layer (ii) and does not remain on the label layer (i) side by making difference so that the adhesiveness to the support layer (ii) is excellent but the adhesiveness to the label layer (i) is inferior. As methods for making difference in the adhesiveness to both layers, there may be mentioned a method of making difference in surface wettability of both layers by performing a surface treatment such as a corona discharge treatment on the surface of the support layer (ii) side but performing no such surface treatment on the surface of the label layer (i) side; by coating the surface of the label layer (i) side with a silicone resin or a fluororesin but performing no such surface treatment on the surface of the support layer (ii) side; and the like.

In the case of using the adhesive layer, at the time when the electrostatic adsorbable sheet (iii) is formed of the label layer (i) and the support layer (ii), the adhesive layer is used for bonding them, and they are laminated and bounded via it. The bonding can be attained according to an ordinary method such as dry lamination of the layers after providing an adhesive agent such as an aqueous adhesive agent, a solvent-based adhesive agent or a hot-melt adhesive agent as an adhesive layer on the support layer (ii) by a method of coating, spraying, melt extrusion lamination or the like and subjecting the label layer (i) to an electrically charging treatment, or melt lamination of the layers via a hot melt film or a melt extrusion film after subjecting the label layer (i) to an electrically charging treatment.

As the adhesive agent in the case of performing the dry lamination, typically mentioned is a flowable and coatable, solution-type or emulsion-type liquid adhesive agent that is prepared by dissolving, dispersing, emulsifying and dispersing, or diluting a resin component of an ether resin, an ester resin, a urethane resin, a urea resin, an acrylic resin, an amide resin, an epoxy resin or the like in a phase of a conventionally known solvent to be used.

Examples of the ether resin include polyether polyols obtained by polymerization of an oxirane compound such as ethylene oxide, propylene oxide, butylene oxide, tetrahydrofuran or the like, using a low-molecular-weight polyol such as propylene glycol, ethylene glycol, glycerin, trimethylolpropane or bisphenol A as an initiator; more concretely polypropylene glycol, polyethylene glycol, polytetramethylene glycol, or the like.

Examples of the ester resin include dehydration reaction products of a polybasic acid and a polyhydric alcohol. The polybasic acid includes isophthalic acid, terephthalic acid, phthalic anhydride, dimethyl isophthalate, dimethyl terephthalate, adipic acid, azelaic acid, sebacic acid, glutaric acid, hexahydrophthalic anhydride, or the like; and one or two or more of these may be used here. The polyhydric alcohol includes ethylene glycol, diethylene glycol, triethylene glycol, trimethylolpropane, propylene glycol, dipropylene glycol, 1,6-hexanediol, neopentyl glycol, hydrogenated bisphenol A, 1,4-butanediol, 1,4-cyclohexanedimethanol, 2,2,4-trimethylpentane-1,3-diol, polyethylene glycol, or the like; and one or two or more of these may be used for polymerization.

Examples of the urethane resin include condensates of at least one of the aforementioned polyhydric alcohol, ether resin and ester resin and an isocyanate compound. For example, there may be mentioned aliphatic isocyanates such as hexamethylene diisocyanate, 2,4-diisocyanato-1-1-methylcyclohexane, diisocyanatocyclobutane, tetramethylene diisocyanate, hydrogenated xylylene diisocyanate, dicyclohexylmethane diisocyanate, dimethyldicyclohexylmethane diisocyanate, lysine diisocyanate, cyclohexane diisocyanate, dodecane diisocyanate, tetramethylxylene diisocyanate, isophorone diisocyanate; aromatic isocyanates such as tolylene 2,4-diisocyanate, tolylene 2,6-diisocyanate, diphenylmethane 4,4'-diisocyanate, 3-methyldiphenylmethane 4,4'-diisocyanate, m- or p-phenylene diisocyanate, o-, m- or p-xylylene diisocyanate, chlorophenylene 2,4-diisocyanate, naphthalene 1,5-diisocyanate, diphenyl 4,4'-diisocyanate, 3,3'-dimethyldiphenyl-1,3,5-triisopropylbenzene-2,4-diisocyanate, carbodiimide-modified diphenylmethane diisocyanate, polyphenylpolymethylene polyisocyanate; isocyanate monomers such as diphenyl ether diisocyanate, or the like. As the isocyanate compound, also usable are polyisocyanate compounds modified with a polyhydric alcohol for increasing the molecular weight of the urethane resin and for imparting thereto various properties such as adhesiveness and stability.

Examples of the urea resin include condensates of the aforementioned isocyanate compound and an amine compound. Examples of the amine compound include aliphatic amines such as ethylenediamine, 1,2-propylenediamine, 1,3-propylenediamine, 1,4-butanediamine, hexamethylenediamine, diethylenetriamine, triethylenetetramine, tetraethylenepentamine; alicyclic polyamines such as isophoronediamine, dicyclohexylmethanediamine, methylcyclohexanediamine, isopropylidene-bis-4-cyclohexyldiamine, 1,4-cyclohexanediamine; heterocyclic amines such as piperazine, methylpiperazine, aminoethylpiperazine, or the like.

Examples of the acrylic resin include those obtained by polymerization of an acrylic compound using an organic peroxide as a polymerization initiator. The acrylic compound includes (meth)acrylic acid, methyl (meth)acrylate, ethyl (meth)acrylate, n-propyl(meth)acrylate, n-butyl (meth)acrylate, t-butyl (meth)acrylate, cyclohexyl(meth)acrylate, 2-ethylhexyl(meth)acrylate, lauryl(meth)acrylate, tridecyl(meth)acrylate, stearyl(meth)acrylate, 2-hydroxyethyl(meth)acrylate, 2-hydroxypropyl(meth)acrylate, (meth)acrylonitrile, (meth)acrylamide, glycidyl(meth)acrylate, and the like. One or two or more of these may be used for polymerization.

Examples of the amide resin include condensates of the aforementioned polybasic acid and the aforementioned amine compound.

Examples of the epoxy resin include condensates obtained by homocondensation reaction of a polyglycidyl ether prepared through reaction of a polyhydric phenol and at least one of an epihalohydrin and a low-molecular weight epoxy compound and by condensation reaction with the aforementioned ether resin, ester resin, urethane resin, urea resin, acrylic resin or amide resin. Specific examples of the polyhydric phenol include bisphenols such as bisphenol A (2,2-bis(4-hydroxyphenyl)propane), bisphenol B (2,2-bis(4-hydroxyphenyl)butane), bisphenol E (2,2-bis(4-hydroxyphenyl)ethane), bisphenol S (2,2-bis(4-hydroxyphenyl)sulfone), 2,2-bis(4-hydroxyphenyl)-4-methylpentane, 1,1-bis(4-hydroxyphenyl)-2-methylpropane, bis(4-hydroxyphenyl)phenylmethane, 2,2-bis(4-hydroxy-3,5-dimethylphenyl)methane, 2,2-bis(4-hydroxy-3,5-dimethylphenyl)ethane, 2,2-bis(4-hydroxy-3,5-dimethylphenyl)propane, 2,2-bis(4-hydroxy-3,5-dimethylphenyl)butane, 2,2-bis(4-hydroxy-3-methylphenyl)butane, 2,2-bis(4-hydroxy-3-methylphenyl)-2-phenylethane, bisphenol, bis(4-hydroxyphenyl)ether, and bis(4-hydroxyphenyl)ketone.

Coating of these adhesive layers are attained with a die coater, a bar coater, a comma coater, a lip coater, a roll coater, a rod coater, a curtain coater, a gravure coater, a spray coater, a blade coater, a reverse coater, an air knife coater, a slide hopper, or the like. If desired, smoothing is carried out thereafter, and the drying step is applied to form the adhesive layer.

It is easy to provide the adhesive layer by applying the aforementioned adhesive agent onto the surface of the support layer (ii) coming into contact with the label layer (i) by the aforementioned coating method, and drying. Then, after subjecting the label layer (i) to an electrically charging treatment to be mentioned later, the support layer (ii) is laminated thereon and attached together by pressure with a pressure roll (nip roll), thereby obtaining the electrostatic adsorbable sheet (iii).

With regard to the thickness of the adhesive layer in the case of providing it by coating, coating is performed so that the thickness after drying is preferably from 0.1 to 100 μm, more preferably from 0.2 to 50 μm, and even more preferably from 0.5 to 25 μm. When the thickness of the adhesive layer is less than 0.1 μm, the place where the adhesive agent is partially not present is generated and the effect of providing the adhesive layer is not obtained in some cases. On the other hand, when the thickness exceeds 100 μm, the dried state and the cured state in the adhesive layer become uneven. Therefore, failure in the adhesive layer easily occurs at the time when the label layer (i) and the support layer (ii) are peeled from each other and the adhesive agent partially remains on the label layer (i), so that the adsorbability of the label layer (i) is inhibited in some cases.

Examples of the hot-melt adhesive include polyolefin resins such as low-density polyethylene, ethylene/vinyl acetate copolymer, metal salt of ethylene/(meth)acrylic acid copolymer (so-called Surlyn), chlorinated polyethylene, and chlorinated polypropylene; polyamide resins, polybutyral resins, urethane resins, and the like.

In the case where a hot-melt adhesive is used, the aforementioned resin is extruded out in a melt film form onto the surface of the support layer (ii) through a die and laminated thereon, and then, after subjecting the label layer (i) to an electrically charging treatment to be mentioned later, the support layer (ii) is superposed and attached together by pressure with a pressure roll, thereby obtaining the electrostatic adsorbable sheet (iii).

The adhesive layer preferably has a weak adhesive force. Primarily, the label layer (i) and the support layer (ii) can be adhered by the electrostatic adsorbability of the label layer (i) without the adhesive layer and the adhesive layer is provided for the purpose of controlling the adhesive force between both layers.

With regard to the electrostatic adsorbable sheet (iii) of the present invention, in order to easily pinch the label layer (i) when the label layer (i) and the support layer (ii) are peeled from each other, it is possible that the label layer (i) may be partly cut away and the support layer (ii) alone may be kept remaining; however, when the adhesive force of the adhesive layer is strong, the electrostatic adsorbable sheets (iii) would be blocked each other since the adhesive layer is exposed at the part from which the label layer (i) has been removed, and thus the desired purpose of the present invention is difficult to achieve. Also, when the adhesive force of the adhesive layer is too strong, an extremely large force is necessary for peeling the label layer (i) and the support layer (ii) from each other and handlability tends to be worse, for example, peeling cannot be cleanly performed and the peeled label layer (i) is easily wrinkled.

For reducing the adhesive force of the adhesive layer and for preventing troubles such as blocking, preferably, the adhesive agent is used with increasing its cohesive force by adding a crosslinking agent thereto. The crosslinking agent to be used for the adhesive layer includes the aforementioned isocyanate compounds and derivatives thereof; isocyanate group-terminated, polycondensed urethane resin isocyanates produced through reaction of the aforementioned polyhydric alcohol, ether resin or ester resin and the isocyanate compound; polyglycidyl ethers and derivatives thereof, melamine resins, and the like. In particular, crosslinking with an isocyanate compound or a urethane resin isocyanate is especially preferable since the crosslinking is possible even at room temperature and hence requires no heat treatment and a risk of causing deformation of the electrostatic adsorbable sheet (iii) by the heat treatment is little.

The amount of the crosslinking agent to be added to the adhesive layer may be suitably determined depending on the adhesive force of the label layer (i) and on the adhesive force of the support layer (ii). The isocyanate compound and the urethane resin isocyanate have a property that they may condense alone. When the amount of the crosslinking agent to be added is increased, the adhesive force tends to lower.

At least one of a lubricant and an inorganic or organic fine powder may be added to the adhesive layer for the purpose of controlling the peelability thereof from the label layer (i). Examples of the lubricant include alcohol lubricants such as cetyl alcohol, stearyl alcohol, polyethylene glycol; fatty acid lubricants such as stearic acid, erucic acid, behenic acid; fatty acid ester lubricants such as ethyl palmitate, butyl stearate, stearyl stearate; fatty acid metal salt lubricants such as calcium stearate, zinc stearate, lithium hydroxystearate; fatty acid amide lubricants such as lauramide, palmitamide, stearamide, oleamide; wax lubricants such as paraffin wax, low-molecular weight polyethylene, low-molecular weight polypropylene, montan wax, carnauba wax, bee wax, privet wax, or the like. Examples of the inorganic fine powder include calcium carbonate, baked clay, silica, diatomaceous earth, talc, titanium oxide, barium sulfate, alumina, or the like. Examples of the organic fine powder include resin particles of polyacrylic acid, polymethacrylic acid, dimethylpolysiloxane, polytetrafluoroethylene, or the like.

The electrostatic adsorbable sheet (iii) of the present invention may contain the above adhesive layer or may not contain the adhesive layer. The present invention includes an embodiment that the resin film layer (A) of the label layer (i) and the support layer (ii) are adsorbed by electrostatic adsorbability alone without the adhesive layer or a peelable layer intervening therebetween. Also, the present invention includes an embodiment that the resin film layer (A) of the label layer (i) and the support layer (ii) are directly electrostatically adsorbed without the adhesive layer or a peelable layer intervening therebetween.

[Electrically Charging Treatment]

The electrostatic adsorbable sheet (iii) of the present invention contains a laminate obtained by subjecting the label layer (i) to an electrically charging treatment and subsequently bringing the support layer (ii) into contact with the resin film layer (A) to attain electrostatic adsorption.

The method for the electrically charging treatment is not specifically limited, and may be carried out according to various known methods. For example, there are mentioned a method of forming the label layer (i) and then applying corona discharge or pulsing high voltage to the surface of the label layer (i) or a method of applying direct-current high voltage to both surfaces of the label layer (i) while both surfaces thereof are held with a dielectric material (electro-electret method); an electret method by irradiating the label layer (i) with ionizing radiation such as γ-rays or electron beams (radio-electret method); and the like.

Figure 4:
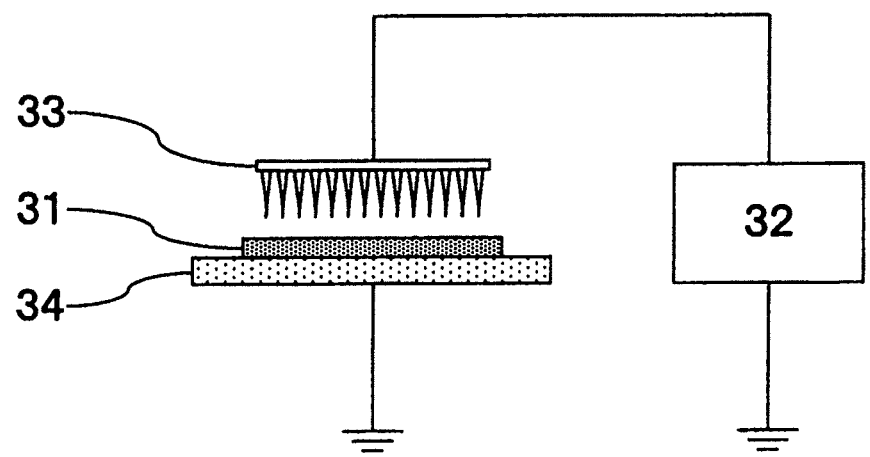
FIG. 4 It is an example of a batch-type corona-discharging apparatus usable in an electrically charging treatment in the present invention.
Figure 5:
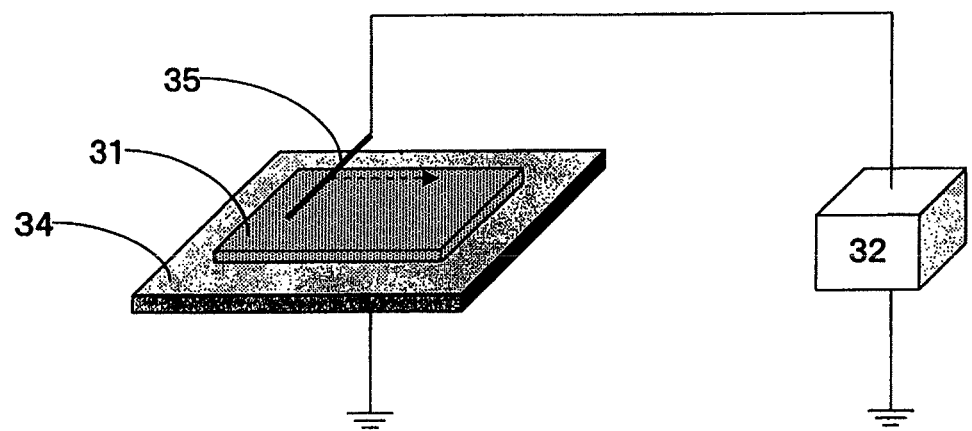
FIG. 5 It is an example of a batch-type corona-discharging apparatus usable in an electrically charging treatment in the present invention.
Figure 6:
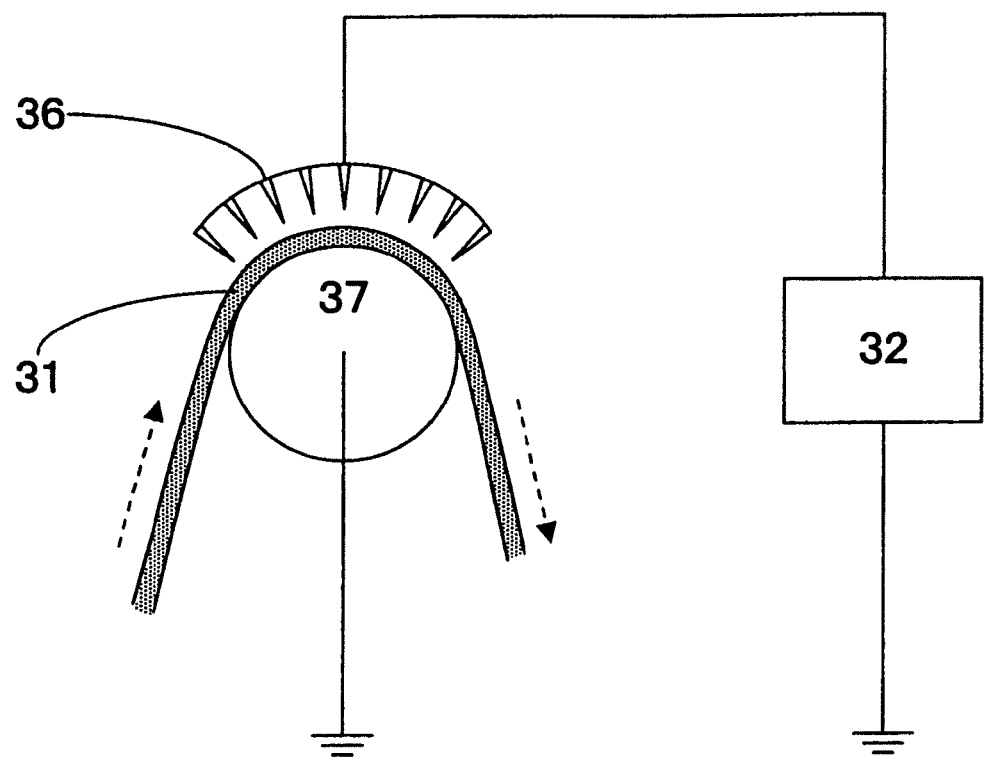
FIG. 6 It is an example of a continuous corona-discharging apparatus usable in an electrically charging treatment in the present invention.
Figure 7:
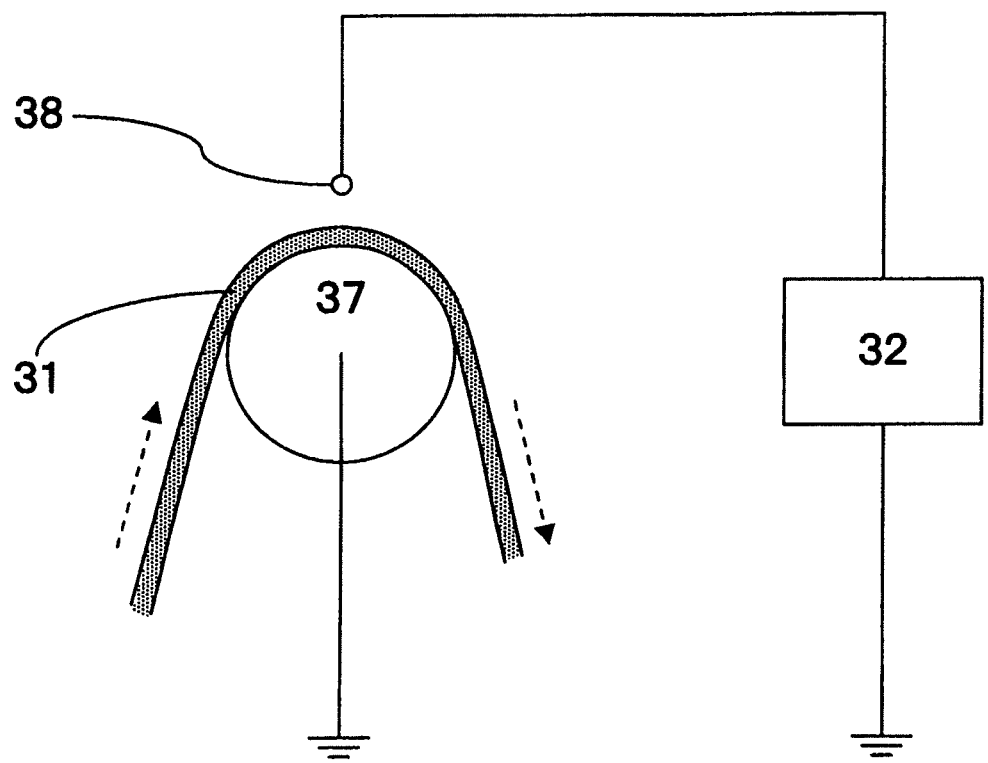
FIG. 7 It is an example of a continuous corona-discharging apparatus usable in an electrically charging treatment in the present invention.

As more concrete examples of the electro-electret method, a method of fixing the label layer (i) between an applied electrode connected to a high-voltage direct-current power source and an earth electrode (batch method, see FIGS. 4 and 5) or a passing-through method (continuous method, see FIGS. 6 and 7) is desirable. Desirably, as a main electrode in the case of using this method, innumerable needle-shaped ones are disposed at even intervals or a metal wire is used, and a flat metal plate or a metal roll is used as a counter electrode.

In the present invention, the electrically charging treatment is preferably a direct-current corona discharge treatment. The direct-current corona discharge treatment usable in the present invention is a treatment of using an apparatus in which a needle-shaped or wire-shaped main electrode (applied electrode) and a flat or roll-shaped counter electrode (earth electrode) are connected to a high-voltage direct-current power source, placing the label layer (i) or the support layer (ii) on the counter electrode, and injecting charges into the label layer (i) or the support layer (ii) by corona discharge generated by applying direct-current high voltage between the main electrode and the counter electrode, as shown in FIGS. 4 to 7.

The space between the main electrode and the counter electrode is preferably from 1 to 50 mm, more preferably from 2 to 30 mm, and further preferably from 5 to 20 mm. When the space between the electrodes is less than 1 mm, it is difficult to keep the distance between the electrodes evenly and there is a case where a uniform electrically charging treatment is not attained in the width direction. On the other hand, when the space exceeds 50 mm, the corona discharge is difficult to generate and the electrically charging treatment on the label layer (i) or the support layer (ii) may become uneven in some cases.

The voltage to be applied between the both electrodes is determined depending on the electric properties of the label layer (i) and the support layer (ii), the shape and material of the main electrode and the counter electrode, and the space of the main electrode and the counter electrode. Concretely, the voltage is preferably from 1 to 100 KV, more preferably from 3 to 70 KV, further preferably from 5 to 50 KV, and particularly preferably from 10 to 30 KV. The polarity of the main electrode may be plus or minus but the main electrode side is preferably minus polarity since a relatively stable corona discharge state is attained.

The materials of the main electrode and the counter electrode are suitably selected from conductive substances but ones made of a metal such as iron, stainless steel, copper, brass or tungsten or ones made of carbon are preferable.

The amount of charges introduced into the label layer (i) or the support layer (ii) by the electrically charging treatment depends on the amount of an electric current that flows between the main electrode and the counter electrode during the treatment. Since the amount of the electric current increases as the voltage between the both electrodes increases, the voltage to be applied is preferably set high to such a degree that the label layer (i) or the support layer (ii) does not reach breakdown.

The electrically charging treatment of the label layer (i) is preferably performed by the above corona discharge or a method of applying high voltage on the surface on which the recording layer (B) is not provided. The recording layer (B) preferably possesses antistatic performance, and the electrically charging treatment on such a surface is not effective since there is a high possibility that imparted charges are scattered to surroundings through the recording layer (B). In the case where the recording layer (B) is in contact with the earth side (metal plate or metal roll), such a problem does not especially occur.

The electrostatic adsorbable sheet (iii) and the label layer (i) of the present invention may be subjected to a discharging treatment after the electrically charging treatment. The discharging treatment makes it possible to avoid troubles in a printing process or in a forming process into a label or the like. For the discharging treatment, usable are known methods using a voltage application charge neutralizer (ionizer), a self-discharge neutralizer or the like. Such ordinary dischargers may remove surface charges but cannot remove the charges accumulated inside the resin film layer (A). Accordingly, the discharging treatment may not have any significant influence on the electrostatic adsorbability of the label layer (i).

Moreover, the electrostatic adsorbable sheet (iii) of the present invention contains a laminate obtained by subjecting the support layer (ii) to the electrically charging treatment and subsequently bringing it into contact with the resin film layer (A) of the label layer (i) to attain electrostatic adsorption. On this occasion, the electrically charging treatment of the support layer (ii) and the subsequent treatment can be performed in the same manner as in the case of the aforementioned label layer (i).

The present invention is more excellent as compared with the invention of forming a laminate film by laminating a support subjected to antistatic treatment on a resin film having a recording layer via an adhesive agent and subsequently imparting charges to the laminate film, which is disclosed in Patent Reference 8, in view of the following effects:

the charging to the label layer (i) is more effectively performed since the electrically charging treatment is performed before the lamination of the label layer (i) and the support layer (ii) and thus a label layer (i) capable of using for display over a long period of time with a high electrostatic adsorbability and a sufficient durability of the electrostatic adsorbability can be obtained, since the lamination of the label layer (i) and the support layer (ii) is performed after the electrically charging treatment, the lamination can be achieved by the electrostatic adsorbability of the label layer (i) and/or the support layer (ii) alone and the adhesive layer is not always needed, and since the electrostatic adsorbability is not exhibited externally in the embodiment of the electrostatic adsorbable sheet (iii) in which the label layer (i) preferably has a recording layer (B) having antistatic performance, there is obtained an electrostatic adsorbable sheet (iii) that hardly causes troubles especially in a printing process and has a good handlability.

[Lamination]

The electrostatic adsorbable sheet (iii) of the present invention contains a laminate obtained by laminating the label layer (i) and the support layer (ii) constituting the sheet through bringing them into contact with each other.

Figure 8:
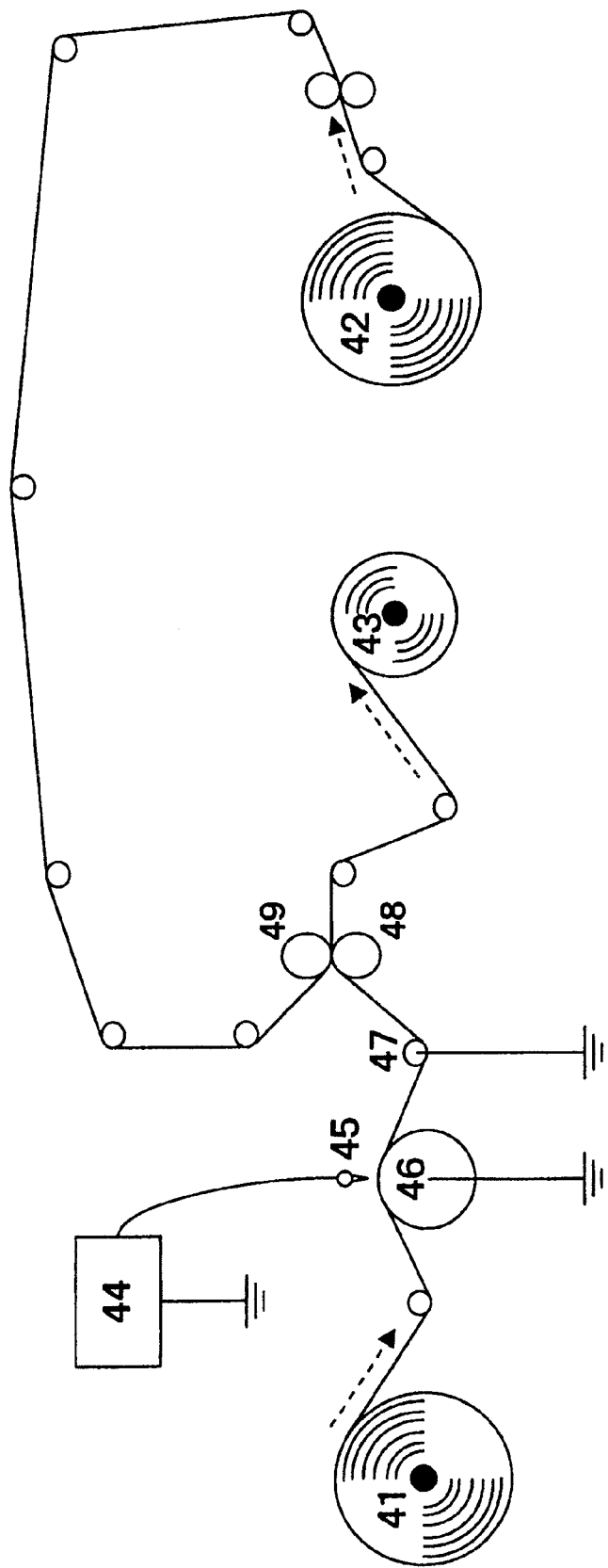
FIG. 8 It is a schematic view of a production apparatus of electrostatic adsorbable sheets (iii) used in Examples of the present invention.

With regard to the lamination of both layers, for example, as shown in FIG. 8, the label layer (i) (or support layer (ii)) is made a long roll (41), the electrically charging treatment is performed with allowing it to pass between electrodes (45) and (46) while unwinding the roll, separately, the support layer (ii) (or label layer (i)) that has been made a long roll (42) is unwound, and the both layers are attached by pressure with a press roll (49), thereby obtaining the electrostatic adsorbable sheet (iii).

If an adhesive layer is provided between the both layers, for example, it is easy to apply an adhesive agent on the support layer (ii) at the place of the roll (48) in FIG. 8.

The present invention also relates to a method for producing the aforementioned electrostatic adsorbable sheet (iii). The method for producing the electrostatic adsorbable sheet (iii) comprises subjecting at lest one of the label layer (i) containing the resin film layer (A) having the recording layer (B) on one side and the support layer (ii) to the electrically charging treatment and subsequently electrostatically adsorbing the resin film layer (A) and the support layer (ii). In one embodiment of the present invention, the label layer (i) is subjected to the electrically charging treatment and subsequently the resin film layer (A) and the support layer (ii) are electrostatically adsorbed. In another embodiment, the support layer (ii) is subjected to the electrically charging treatment and subsequently the resin film layer (A) and the support layer (ii) are electrostatically adsorbed.

[Recorded Material]

The recorded material of the present invention can be obtained by printing at least one of the surface on the label layer (i) side and the surface on the support layer (ii) side of the electrostatic adsorbable sheet (iii) of the present invention.

[Printing]

The electrostatic adsorbable sheet (iii) of the present invention can be printed on the surface of the recording layer (B) of the label layer (i). For the printing, employable are known methods such as offset printing, gravure printing, flexographic printing, letter press printing, screen printing, an inkjet recording method, a thermal recording method, a thermal transfer recording method, or an electrophotographic recording method. However, preferred is the offset printing or the inkjet recording method in which a change in design and size is easy. As the printing ink, employable is oil based ink, water based ink or UV ink, but preferred is UV ink that is fast in drying rate.

[Thickness]

The thickness in the present invention is in accordance with JIS-K-7130 and is measured by means of a constant-pressure thickness tester (manufactured by Teclock Corporation, trade name: PG-01J).

In the case where the formed resin film layer (A) has a multilayer structure, thickness of each layer is determined by cooling an objective sample to be measured to a temperature of −60° C. or lower with liquid nitrogen, cutting the sample placed on a glass plate with applying a razor blade (manufactured by Schick Japan, trade name: PROLINE BLADE) at right angle to prepare a sample for cross-section observation, performing cross-section observation on the resulting sample by means of a scanning electron microscope (manufactured by JEOL ltd., trade name: JSM-6490), discriminating a border of each thermoplastic resin composition based on compositional appearance, and multiplying the total thickness of the resin film layer (A) by each layer thickness ratio observed.

[Surface Resistivity]

In the case where the surface resistivity is $1 \times 10^7 \Omega$ or more under the condition at 23° C. and at a relative humidity of 50%, the surface resistivity in the present invention is measured using an electrode of a double ring method in accordance with JIS-K-6911. In the case where the surface resistivity is less than $1 \times 10^7 \Omega$, resistance (R) determined by measurement according to a four-point probe method in accordance with JIS-K-7194 is multiplied by a correction coefficient F and the product is taken as the surface resistivity.

[Opacity]

The opacity of the present invention is shown as a value of a ratio of light reflectivity (black board/white board) shown as percentage, which is observed with applying black and white standard boards to measurement back in accordance with JIS-P-8138.

In one embodiment of the present invention, the opacity of the label layer (i) is from 50 to 100%, preferably from 60 to 100%, and more preferably from 70 to 100%. When the opacity is 50% or more, the coloring and design/pattern of an object to be attached are not seen through the layer when used as a label and decorativeness is excellent when used on an object to be attached having coloring and design/pattern.

In another embodiment of the present invention, the opacity of the label layer (i) is from 0% or more and less than 50%, preferably in a range of from 0.1% to 48%. When the opacity is less than 50%, at the time when the layer is used on a transparent object to be attached such as glass, the printed design applied on the printing layer (B) can be observed through the object to be attached, and thus the layer becomes a label having an excellent decorativeness.

[Water Vapor Permeation Coefficient]

It was measured under the condition of at 40° C. and 90% RH by a cup method in accordance with BS-Z-0208. From the obtained moisture permeability (g/(m²·24 hr)) and the film thickness (mm), the water vapor permeation coefficient (g/·mm/m²·24 hr) was determined.

The water vapor permeation coefficient of the label layer (i) to be used in the electrostatic adsorbable sheet (iii) of the present invention is preferably within a range of from 0.01 to 2.50, more preferably from 0.01 to 2.00. When the water vapor permeation coefficient is more than 2.50, the electric chargeability under a high-humidity condition may greatly lower and the film adsorbability may greatly lower, and thus, the sheet could not attain the intended performance of the present invention as an adsorbable label. On the other hand, when a label layer (i) having a water vapor permeation coefficient of less than 0.01 is used, the charge-maintaining performance is excellent but, since the inner charges are difficult to migrate, the adsorbability tends to be low and the sheet could not attain the intended performance of the present invention.

[Gurley Stiffness]

The Gurley stiffness in the present invention is measured in each of MD and TD directions in an environment at a temperature of 23° C. and a humidity of 50% RH, in accordance with JAPAN TAPPI No. 40:2000. The Gurley stiffness of the label layer (i) in the present invention is preferably from 5 to 1,000 mgf, more preferably from 5 to 700 mgf, and even more preferably from 5 to 400 mgf; and the Gurley stiffness of the support layer (ii) is preferably from 5 to 10,000 mgf, more preferably from 5 to 7,000 mgf, and even more preferably from 5 to 3,000 mgf. When the Gurley stiffness of the label layer (i) is less than 5 mgf, the layer may have low stiffness and may be difficult to handle as a label, and in addition, it may easily shrink to worsen its appearance. When more than 1,000 mgf, the layer may have high stiffness and could not uniformly attach to an object to be attached in the case of a weak electrostatic adsorbability if it curls only a little, and as a result, the durability of the adsorbability may be poor. When the Gurley stiffness of the support layer (ii) is less than 5 mgf, the support layer (ii) could hardly be pinched, and a notch could hardly be formed at the time of peeling the label layer (i) from it in some cases. When more than 10,000 mgf, deformation of the support layer (ii) becomes difficult and transportability of the electrostatic adsorbable sheet (iii) is poor, so that handling becomes difficult in some cases.

[Relative Dielectric Constant]

For the measurement of the relative dielectric constant, a measuring method is selected depending on a measuring frequency range. An extremely low frequency bridge is use in the case where the measuring frequency is 10 Hz or less, a transformer bridge is used in the case of from 10 Hz to 3 MHz, and a parallel T-type bridge, a high frequency Schering bridge, a Q meter, a resonance method, a standing wave method, and a cavity resonance method are used in the case where the frequency exceeds 1 MHz. In addition, it can be also measured by an LCR meter or the like wherein voltage/current vectors are measured on a circuit component for an alternating current signal of the measuring frequency, and electrostatic capacity is calculated from the values.

As a measuring apparatus for measuring the relative dielectric constant of the support layer (ii), preferred is a measuring apparatus that sandwiches, at a constant pressure, a sample between a flat applied electrode and a flat guard electrode disposed in parallel, can apply a voltage of about 5 V, and allows arbitrary selection of the measuring frequency. According to such a measuring apparatus, frequency dependency of the sample can be grasped by changing the frequency and can be used as an index of a suitable use range. The sample preferably has an even thickness and smooth surface as far as possible. When the surface conditions are bad, a gap (air layer) is formed between the sample and the electrodes and a measured value may have a large error. In this case, for complete electric contact between the sample and the electrodes, application of a silver conductive coating or vacuum deposition is preferred. Concrete examples of the measuring apparatus include "4192A LF IMPEDANCE ANALYZER" of Agilent Technologies, "LCR METER 4274A" of Yokogawa Electric Corporation, "HIOKI 3522 LCR HIGH TESTER" of Hioki E.E. Corporation, and the like.

For the measurement of relative dielectric constant of the support layer (ii) of the present invention, using "4192A LF IMPEDANCE ANALYZER" of Agilent Technologies, under an environmental conditions at a temperature of 23° C. and a relative humidity of 50%, a sample larger than the electrode diameter is sandwiched between a main electrode having a diameter of 38 mm and a counter electrode having a diameter of 56 mm so that a surface having a high surface resistivity faces to the main electrode side, a voltage of 5V is applied, measurement is performed at a frequency ranging from 10 Hz to 1 MHz, and a measured value at a frequency of 100 Hz is taken as a representative value.

[Display Material]

Examples of display materials composed of the label layer (i) obtained by peeling the support layer (ii) from the aforementioned recorded materials include POP cards (poster, sticker, display, or the like), shop guides (pamphlet, company guide, list of goods, menu, or the like), mats (lunch mat, table mat, stationery, or the like), manuals (various manuals for duty assignment, work, operation, or the like, process sheet, time schedule, or the like), charts (marine chart, weather map, graphic chart, ruled chart, or the like), catalogues, maps (marine map, route map, outdoor map, or the like), shop price lists, mountain climbing guides, visiting cards, lost child ID cards, cooking recipes, guide boards (floor guide, direction/destination guide, or the like), schedule tables, road signs (for funeral/housing exhibition place, or the like), room identification cards, school record tables, signboards (for keep out, forest road construction, or the like), compartment piles, doorplates, calendars (with image), simple whiteboards, mouse pads, packaging materials (packaging paper, box, bag, or the like), coasters, or the like, and the sheet is applicable to any of these. In particular, the sheet is suitably used in applications presupposing indoor use.

[Object to be Attached]

Examples of the object to be attached, which adsorbs a display material composed of the label layer (i) obtained by peeling the support layer (ii) from the aforementioned recorded material, includes notice boards, advertising display, signboards, whiteboards, walls, ceilings, pillars, doors, partition boards, floors, lockers, desks, bookshelves, windows (glass-made, resin-made), refrigerators (metal surfaces, glass surfaces, plastic surfaces), various devices (machine tools, printing machines, making machines, or the like), and wall surfaces of inside of cars (automobiles, buses, trains), inside of ships and inside of air planes, or the like, and any of these is applicable. Particularly, in the case where the object to be attached has a high surface smoothness, the area to be adhered to the display material of the present invention increases and also the resulting electrostatic adsorbability heightens, such an object to be attached can be preferably applied.

EXAMPLES

The present invention is described more specifically below with reference to Production Examples, Preparation Examples, Examples, Comparative Examples and Test Examples. The material, amount to be used, ratio, handling, or the like mentioned below may be suitably changed as long as it does not depart from the sprit of the present invention. Accordingly, the scope of the present invention should not be limited by the specific examples mentioned below. Incidentally, unless otherwise specifically indicated, "%" mentioned below is % by weight.

Thermoplastic resin compositions used in Production Examples for the resin film layer (A) in the present invention are shown collectively in Table 1. The resin compositions (a) to (j) obtained by mixing the raw materials described in Table 1 in the ratios described in Table 1 beforehand were melt and kneaded in a twin-screw kneader set at 210° C. and then were extruded into a strand form with an extruder set at 230° C., and, after cooling, they were cut with a strand cutter to prepare pellets of the resin compositions (a) to (j), which were used in the following Production Examples.

TABLE 1

| | Thermoplastic resin composition blend ratio (% by weight) | | | | | | | | | |
|---|---|---|---|---|---|---|---|---|---|---|
| Material used | a | b | c | d | e | f | g | h | i | j |
| Propylene homopolymer (manufactured by Nippon Polypropylene Corporation, trade name: Novatec PP FY4, MFR (230° C., 2.16 kg load): 5 g/10 min, melting point: 165° C.) | 80 | 70 | — | — | — | 100 | 100 | 85 | 80 | 70 |
| Propylene homopolymer (manufactured by Nippon Polypropylene Corporation, trade name: Novatec PP MA3, MFR (230° C., 2.16 kg load): 11 g/10 min, melting point: 165° C.) | — | — | 60 | 55 | 35 | — | — | — | — | — |
| High-density polyethylene (manufactured by Nippon Polyethylene Corporation, trade name: Novatec HD HJ360, MFR (190° C., 2.16 kg load): 5 g/10 min, melting point: 131° C.) | 10 | 10 | 10 | 5 | 5 | — | — | 10 | 10 | 10 |
| Heavy calcium carbonate (manufactured by Bihoku Funka Kogyo Co., Ltd., trade name: SOFTON 1800, average particle size: 1.2 µm) | 10 | 20 | 30 | 40 | 60 | — | — | 5 | 10 | 20 |

Production Example 1 for Resin Film Layer (A)

The thermoplastic resin (a) and the thermoplastic resin (b) were separately melt and kneaded in three extruders set at 230° C., and then fed into an extrusion die set at 250° C. and laminated in the die, followed by extruding into a sheet form and cooling to 60° C. with a cooling device to obtain an unstretched sheet.

The unstretched sheet was heated to 135° C. and stretched fivefold in the lengthwise direction (MD) using the peripheral speed difference between rolls. Next, the fivefold-stretched sheet was cooled to 60° C., then using a tenter oven, this was again heated to about 155° C. and stretched eightfold in the lateral direction (TD), and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 40 µm, a porosity of 18%, and a three-layer structure [each layer resin composition (b/a/b), each layer thickness (5 μm/30 μm/5 μm), each layer stretching mode (biaxial/biaxial/biaxial)].

Production Example 2 for Resin Film Layer (A)

The thermoplastic resin (b) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 135° C. and stretched fivefold in the lengthwise direction using the peripheral speed difference between rolls. Then, the thermoplastic resin (c) was melt and kneaded in two extruders set at 250° C., followed by extruding into a sheet form and laminating on both surfaces of the fivefold-stretched sheet prepared above, respectively, to obtain a laminated sheet having a three-layer structure. Next, the laminated sheet was cooled to 60° C., then using a tenter oven, this was again heated to about 150° C. and stretched 8.5-fold in the lateral direction, and thereafter a heat treatment was carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 50 μm, a porosity of 29%, and a three-layer structure [each layer resin composition (c/b/c), each layer thickness (10 μm/30 μm/10 μm), each layer stretching mode (monoaxial/biaxial/monoaxial)].

Production Example 3 for Resin Film Layer (A)

The thermoplastic resin (c) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 140° C. and stretched 4.5-fold in the lengthwise direction using the peripheral speed difference between rolls. Then, the thermoplastic resin (d) was melt and kneaded in two extruders set at 250° C., followed by extruding into a sheet form and laminating on both surfaces of the 4.5-fold-stretched sheet prepared above, respectively, to obtain a laminated sheet having a three-layer structure. Next, the laminated sheet was cooled to 60° C., then using a tenter oven, this was again heated to about 135° C. and stretched eightfold in the lateral direction, and thereafter a heat treatment was further carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 80 μm, a porosity of 37%, and a three-layer structure [each layer resin composition (d/c/d), each layer thickness (10 μm/60 μm/10 μm), each layer stretching mode (monoaxial/biaxial/monoaxial)].

Production Example 4 for Resin Film Layer (A)

The thermoplastic resin (a) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 150° C. and stretched fivefold in the lengthwise direction using the peripheral speed difference between rolls. Then, the thermoplastic resin (a) was melt and kneaded in two extruders set at 250° C., followed by extruding into a sheet form and laminating on both surfaces of the fivefold-stretched sheet prepared above, respectively, to obtain a laminated sheet having a three-layer structure. Next, the laminated sheet was cooled to 60° C., then using a tenter oven, this was again heated to about 145° C. and stretched sevenfold in the lateral direction, and thereafter a heat treatment was further carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 60 μm, a porosity of 8%, and a three-layer structure [each layer resin composition (a/a/a), each layer thickness (10 μm/40 μm/10 μm), each layer stretching mode (monoaxial/biaxial/monoaxial)].

Production Example 5 for Resin Film Layer (A)

The thermoplastic resin (b) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 135° C. and stretched fourfold in the lengthwise direction using the peripheral speed difference between rolls. Then, the thermoplastic resin (d) was melt and kneaded in two extruders set at 250° C., followed by extruding into a sheet form and laminating on both surfaces of the fourfold-stretched sheet prepared above, respectively, to obtain a laminated sheet having a three-layer structure. Next, the laminated sheet was cooled to 60° C., then using a tenter oven, this was again heated to about 150° C. and stretched ninefold in the lateral direction, and thereafter a heat treatment was further carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 140 μm, a porosity of 36%, and a three-layer structure [each layer resin composition (d/b/d), each layer thickness (30 μm/80 μm/30 μm), each layer stretching mode (monoaxial/biaxial/monoaxial)].

Production Example 6 for Resin Film Layer (A)

The thermoplastic resin (d) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 140° C. and stretched fourfold in the lengthwise direction using the peripheral speed difference between rolls. Then, the thermoplastic resin (e) was melt and kneaded in two extruders set at 250° C., followed by extruding into a sheet form and laminating on both surfaces of the fourfold-stretched sheet prepared above, respectively, to obtain a laminated sheet having a three-layer structure. Next, the laminated sheet was cooled to 60° C., then using a tenter oven, this was again heated to about 140° C. and stretched eightfold in the lateral direction, and thereafter a heat treatment was further carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 80 μm, a porosity of 57%, and a three-layer structure [each layer resin composition (e/d/e), each layer thickness (15 μm/50 μm/15 μm), each layer stretching mode (monoaxial/biaxial/monoaxial)].

Production Example 7 for Resin Film Layer (A)

The thermoplastic resin composition (f) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 150° C. and stretched fivefold in the lengthwise direction using the peripheral speed difference between rolls, followed by cooling to 40° C. Then, using a tenter oven, this was again heated to about 150° C. and stretched eightfold in the lateral direction, and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 20 μm, a porosity of 0%, and a single layer structure.

Production Example 8 for Resin Film Layer (A)

The thermoplastic resin composition (f) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to 150° C. and stretched fivefold in the lengthwise direction using the peripheral speed difference between rolls, followed by cooling to 40° C. Then, using a tenter oven, this was again heated to about 150° C. and stretched eightfold in the lateral direction, and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 40 μm, a porosity of 0%, and a single layer structure.

Production Example 9 for Resin Film Layer (A)

The thermoplastic resin composition (g) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to about 145° C. and stretched fivefold in the lengthwise direction (MD) using the peripheral speed difference between rolls, followed by cooling to 60° C. Then, using a tenter oven, the monoaxially stretched film was again heated to about 155° C. and stretched nine-fold in the lateral direction (TD), and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 40 μm, a porosity of 0%, and a single layer structure.

Production Example 10 for Resin Film Layer (A)

The thermoplastic resin composition (g) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to about 150° C. and stretched fivefold in the lengthwise direction using the peripheral speed difference between rolls, followed by cooling to 40° C. Then, using a tenter oven, the monoaxially stretched film was again heated to about 150° C. and stretched eightfold in the lateral direction, and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 20 μm, a porosity of 0%, and a single layer structure.

[Production Example 11 for Resin Film Layer (A)]

The thermoplastic resin (g) and the thermoplastic resin (h) were separately melt and kneaded in three extruders set at 230° C., and then fed into an extrusion die set at 250° C. and laminated in the die, followed by extruding into a sheet form and cooling to 60° C. with a cooling device to obtain an unstretched sheet.

The unstretched sheet was heated to about 140° C. and stretched 4.5-fold in the lengthwise direction using the peripheral speed difference between rolls, followed by cooling to 60° C. Then, using a tenter oven, the monoaxially stretched film was again heated to about 150° C. and stretched eightfold in the lateral direction, and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 70 μm, a porosity of 0.1%, and a three-layer structure [each layer resin composition (h/g/h), each layer thickness (3 μm/64 μm/3 μm), each layer stretching mode (biaxial/biaxial/biaxial)].

Production Example 12 for Resin Film Layer (A)

The thermoplastic resin (g) and the thermoplastic resin (h) were separately melt and kneaded in three extruders set at 230° C., and then fed into an extrusion die set at 250° C. and laminated in the die, followed by extruding into a sheet form and cooling to 60° C. with a cooling device to obtain an unstretched sheet.

The unstretched sheet was heated to about 150° C. and stretched fourfold in the lengthwise direction using the peripheral speed difference between rolls, followed by cooling to 60° C. Then, using a tenter oven, the monoaxially stretched film was again heated to about 155° C. and stretched eightfold in the lateral direction, and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 60 μm, a porosity of 2.6%, and a three-layer structure [each layer resin composition (g/h/g), each layer thickness (10 μm/40 μm/10 μm), each layer stretching mode (biaxial/biaxial/biaxial)].

Production Example 13 for Resin Film Layer (A)

The thermoplastic resin (h) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to about 150° C. and stretched fivefold in the lengthwise direction using the peripheral speed difference between rolls, followed by cooling to 60° C. Then, the thermoplastic resin (i) was melt and kneaded in two extruders set at 250° C., followed by extruding into a sheet form from an extrusion die, laminating on both surfaces of the monoaxially stretched film prepared above, respectively, and then cooling to 60° C. to obtain a laminated sheet having a three-layer structure. Next, using a tenter oven, the laminated sheet was again heated to about 155° C. and stretched eightfold in the lateral direction, and thereafter a heat treatment was further carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 80 μm, a porosity of 3.9%, and a three-layer structure [each layer resin composition (i/h/i), each layer thickness (20 μm/40 μm/20 μm), each layer stretching mode (monoaxial/biaxial/monoaxial)].

Production Example 14 for Resin Film Layer (A)

The thermoplastic resin (h) was melt and kneaded in an extruder set at 230° C., then fed into an extrusion die set at 250° C., followed by extruding into a sheet form and cooling to 60° C. with a cooling device to obtain an unstretched sheet.

The unstretched sheet was heated to about 145° C. and stretched fourfold in the lengthwise direction using the peripheral speed difference between rolls, followed by cooling to 60° C. Then, the thermoplastic resin (h) was melt and kneaded in two extruders set at 250° C., followed by extruding into a sheet form from an extrusion die, laminating on both surfaces of the monoaxially stretched film prepared above, respectively, and then cooling to 60° C. to thereby obtain a laminated sheet having a three-layer structure. Next, using a tenter oven, the laminated sheet was again heated to about 150° C. and stretched nine-fold in the lateral direction, and thereafter a heat treatment was further carried out by heating to 160° C.

Subsequently, this was cooled to 60° C., and, after the deckle edges are trimmed, both surfaces of the laminated film was subjected to a surface treatment by corona discharge, thereby obtaining a resin film layer (A) having a thickness of 130 μm, a porosity of 4.0%, and a three-layer structure [each layer resin composition (h/h/h), each layer thickness (40 μm/50 μm/40 μm), each layer stretching mode (monoaxial/biaxial/monoaxial)].

Production Example 15 for Resin Film Layer (A)

The thermoplastic resin (i) and the thermoplastic resin (j) were separately melt and kneaded in three extruders set at 230° C., and then fed into an extrusion die set at 250° C., and laminated in the die, followed by extruding into a sheet form and cooling to 60° C. with a cooling device to obtain an unstretched sheet.

The unstretched sheet was heated to about 135° C. and stretched fivefold in the lengthwise direction using the peripheral speed difference between rolls, followed by cooling to 60° C. Then, using a tenter oven, the monoaxially stretched film was again heated to about 155° C. and stretched eightfold in the lateral direction, and thereafter a heat treatment was further carried out by heating to 160° C.

Subsequently, this was cooled to 60° C., and, after the deckle edges are trimmed, both surfaces of the biaxially stretched film was subjected to a surface treatment by corona discharge, thereby obtaining a resin film layer (A) having a thickness of 40 μm, a porosity of 18%, and a three-layer structure [each layer resin composition (j/i/j), each layer thickness (5 μm/30 μm/5 μm), each layer stretching mode (biaxial/biaxial/biaxial)].

The physical properties of the resin film layers (A) obtained in Production Examples are shown collectively in Table 2.

TABLE 2

| Production Example of Resin Film Layer (A) | Constitution of resin film layer (A) | | | Porosity of resin film layer (A) % |
|---|---|---|---|---|
| | Thermoplastic resin composition used | Stretching mode of each layer | Thickness (each layer) μm | |
| Production Example 1 | b/a/b | biaxial/biaxial/biaxial | 40 (5/30/5) | 18 |
| Production Example 2 | c/b/c | monoaxial/biaxial/monoaxial | 50 (10/30/10) | 29 |
| Production Example 3 | d/c/d | monoaxial/biaxial/monoaxial | 80 (10/60/10) | 37 |
| Production Example 4 | a/a/a | monoaxial/biaxial/monoaxial | 60 (10/40/10) | 8 |
| Production Example 5 | d/b/d | monoaxial/biaxial/monoaxial | 140 (30/80/30) | 36 |
| Production Example 6 | e/d/e | monoaxial/biaxial/monoaxial | 80 (15/50/15) | 57 |
| Production Example 7 | f | biaxial | 20 | 0 |
| Production Example 8 | f | biaxial | 40 | 0 |
| Production Example 9 | g | biaxial | 40 | 0 |
| Production Example 10 | g | biaxial | 20 | 0 |
| Production Example 11 | h/g/h | biaxial/biaxial/biaxial | 70 (3/64/3) | 0.1 |
| Production Example 12 | g/h/g | biaxial/biaxial/biaxial | 60 (10/40/10) | 2.6 |
| Production Example 13 | i/h/i | monoaxial/biaxial/monoaxial | 80 (20/40/20) | 3.9 |
| Production Example 14 | h/h/h | monoaxial/biaxial/monoaxial | 130 (40/50/40) | 4.0 |
| Production Example 15 | j/i/j | biaxial/biaxial/biaxial | 40 (5/30/5) | 18 |

Preparation Example 1 of Polymer Having Antistatic Function

Into a four-neck flask fitted with a stirring device, a reflux condenser, a thermometer, and a dropping funnel were introduced 100 parts by weight of polyethylene glycol monomethacrylate (manufactured by NOF Corporation, trade name: BLENMER-PE-350), 20 parts by weight of lithium perchlorate (manufactured by Wako Pure Chemical Industries, Ltd., Reagent), 1 part by weight of hydroquinone (manufactured by Wako Pure Chemical Industries, Ltd., Reagent) and 400 parts by weight of propylene glycol monoethyl ether (manufactured by Wako Pure Chemical Industries, Ltd., Reagent), and the inside of the system was subjected to nitrogen substitution, followed by reaction at 60° C. for 40 hours. Thereto were added 5 parts by weight of stearyl methacrylate (manufactured by Wako Pure Chemical Industries, Ltd., Reagent), 5 parts by weight of n-butyl methacrylate (manufactured by Wako Pure Chemical Industries, Ltd., Reagent), and 1 part by weight of azobisisobutyronitrile (manufactured by Wako Pure Chemical Industries, Ltd., Reagent), followed by polymerization reaction at 80° C. for 3 hours. Thereafter, the solid content was adjusted to 20% by weight by adding propylene glycol monoethyl ether to obtain a solution of a polymer having antistatic function composed of an alkali metal salt-containing polymer, which had a weight-average molecular weight of about 300,000 and a lithium concentration in the solid content of 0.6% by weight.

Preparation Example 2 of Polymer Having Antistatic Function

Into a four-neck flask fitted with a stirring device, a reflux condenser, a thermometer, and a dropping funnel were introduced 35 parts by weight of N,N-dimethylaminoethyl methacrylate (manufactured by Mitsubishi Gas Chemical Co., Inc.), 20 parts by weight of ethyl methacrylate (manufactured by Wako Pure Chemical Industries, Ltd., Reagent), 20 parts by weight of cyclohexyl methacrylate (manufactured by Wako Pure Chemical Industries, Ltd., Reagent), 25 parts by weight of stearyl methacrylate (manufactured by Wako Pure Chemical Industries, Ltd., Reagent), 150 parts by weight of ethyl alcohol, 1 part by weight of azobisisobutyronitrile (manufactured by Wako Pure Chemical Industries, Ltd., Reagent), and the inside of the system was subjected to nitrogen substitution, followed by polymerization reaction at 80° C. for 6 hours under nitrogen stream. Then, 85 parts by weight of a 50% by weight aqueous solution of 3-chloro-2-hydroxypropyltrimethylammonium chloride (manufactured by Wako Pure Chemical Industries, Ltd., Reagent) was added thereto, followed by further reaction at 80° C. for 15 hours. Thereafter, ethyl alcohol was removed by evaporation with adding water dropwise to obtain a solution of a polymer having antistatic function composed of a quaternary ammonium salt-type copolymer, which had a content of 20% by weight as final solid content.

Preparation Example 1 of Polymer Binder

Into a four-neck flask fitted with a stirrer, a reflux condenser, a thermometer, and a dropping funnel were charged 15 parts by weight of 2-hydroxyethyl methacrylate (manufactured by Wako Pure Chemical Industries, Ltd., Reagent), 50 parts by weight of methyl methacrylate (manufactured by Wako Pure Chemical Industries, Ltd., Reagent), 35 parts by weight of ethyl acrylate (manufactured by Wako Pure Chemical Industries, Ltd., Reagent), and 100 parts by weight of toluene (manufactured by Wako Pure Chemical Industries, Ltd., Reagent), and after nitrogen substitution, 0.6 parts by weight of 2,2'-azobis(isobutyronitrile) (manufactured by Wako Pure Chemical Industries, Ltd., Reagent) was introduced as an initiator, followed by polymerization at 80° C. for 4 hours. The resulting solution was a 50% toluene solution of a hydroxyl group-containing methacrylate ester polymer having a hydroxyl value of 65. Then, to 100 parts by weight of the solution was added 30 parts by weight of a 20% methyl ethyl ketone solution of a vinyl chloride/vinyl acetate copolymer (manufactured by Shin Dai-Ichi Vinyl Corporation, trade name: ZEST C150ML), and the solid content was adjusted to 20% by weight by adding methyl ethyl ketone (manufactured by Wako Pure Chemical Industries, Ltd., Reagent) to obtain a polymer binder solution.

Preparation Example 2 of Polymer Binder

Into a four-neck flask fitted with a stirrer, a reflux condenser, a thermometer, and a dropping funnel were charged 62.9 parts by weight of N,N-dimethylaminoethyl methacrylate (manufactured by Mitsubishi Gas Chemical Co., Inc.), 71 parts by weight of butyl methacrylate (manufactured by Wako Pure Chemical Industries, Ltd., Reagent), 25.4 parts by weight of lauryl methacrylate (manufactured by Wako Pure Chemical Industries, Ltd., Reagent), and 200 parts by weight of isopropyl alcohol (manufactured by Wako Pure Chemical Industries, Ltd., Reagent), and after nitrogen substitution, 0.9 parts by weight of 2,2'-azobis(isobutyronitrile) (manufactured by Wako Pure Chemical Industries, Ltd., Reagent) was added as an initiator, followed by polymerization reaction at 80° C. for 4 hours. Then, after the solution was neutralized with 24 parts by weight of acetic acid (manufactured by Wako Pure Chemical Industries, Ltd., Reagent), water was added with removing isopropyl alcohol (manufactured by Wako Pure Chemical Industries, Ltd., Reagent) by evaporation to finally obtain a viscous aqueous solution of a dispersing agent (a) having a solid content of 35%.

An ethylene/methacrylic acid copolymer (manufactured by Du Pont-Mitsui Polychemicals Co., Ltd., trade name: NUCREL N1035) was continuously fed to an intermeshed co-rotation twin-screw extruder (manufactured by Ikegai Corporation, trade name: PCM45ϕ) in a rate of 100 parts/hour. Also, while the above aqueous solution of the dispersing agent (a) was continuously fed from the first injection port of the extruder in a rate of 22.9 parts/hour (8 parts/hour as solid content of the dispersing agent) and further water was continuously fed from the second injection port in a rate of 70 parts/hour, the whole was continuously kneaded and extruded at a heating temperature (cylinder temperature) of 130° C. to obtain a milky-white aqueous resin dispersion. After the aqueous resin dispersion was filtrated through a 250-mesh stainless steel-made wire gauze, the solid content was adjusted to 45% by weight by adding water to obtain a polymer binder solution.

Preparation Example 3 of Polymer Binder

Into a four-neck flask equipped with a stirrer, a reflux condenser, a thermometer, and a nitrogen gas inlet were introduced 100 parts by weight of a 25% by weight aqueous solution of polyethyleneimine (manufactured by Nippon Shokubai Co., Ltd., trade name: EPOMINE P-1000), 10 parts by weight of 1-chlorobutane (manufactured by Wako Pure Chemical Industries, Ltd., Reagent), and 10 parts by weight of propylene glycol monomethyl ether (manufactured by Wako Pure Chemical Industries, Ltd., Reagent), and the whole was stirred under a nitrogen stream, followed by modification reaction at 80° C. for 20 hours. Then, the solid content was adjusted to 20% by weight by adding water to the solution to obtain a polymer binder solution.

Preparation Examples 1 and 5 of Recording Layer (B)

While methyl ethyl ketone was softly stirred in a Kaures mixer, each of the weighed pigment particles described in Table 3 was added thereto little by little to adjust the solid concentration to 20% by weight. Thereafter, the whole was stirred with increasing the number of rotation of the Kaures mixer for 30 minutes to prepare a pigment dispersion.

Then, the number of rotation of the Kaures mixer was decreased, and each of the polymer binder solutions described in the above Preparation Examples, a solution of a polymer having antistatic function, and a solution of the curing agent described in Table 3 (diluted to a solid content of 20% by weight with ethyl acetate) were added to the pigment dispersion in this order so as to be the blend ratio described in Table 3. After the whole was stirred for 20 minutes without further treatment, it was filtrated through a 100-mesh filter to remove coarse particles, followed by diluting with methyl ethyl ketone so as to be the solid concentration described in Table 3, thereby obtaining a coating solution for recording layer (B) (Preparation Examples 1 and 5).

Preparation Example 2 of Recording Layer (B)

While methyl ethyl ketone was softly stirred in a Kaures mixer, thereto were added each of the polymer binder solutions described in the above Preparation Examples, a solution of a polymer having antistatic function, and a solution of the curing agent described in Table 3 (diluted to a solid content of 20% by weight with ethyl acetate) in this order so as to be the blend ratio described in Table 3. The whole was stirred for 20 minutes to achieve mixing, followed by diluting with methyl ethyl ketone so as to be the solid concentration described in Table 3, thereby obtaining a coating solution for recording layer (B) (Preparation Example 2).

Preparation Examples 3 and 4 of Recording Layer (B)

To a vessel equipped with a stirrer were added each of the polymer binder solutions described in Table 3 and a solution of a polymer having antistatic function in this order so as to be the blend ratio described in Table 3. Then, the whole was diluted with water so as to be the solid concentration described in Table 3 and was stirred for 20 minutes without further treatment, thereby obtaining a coating solution for recording layer (B) (Preparation Examples 3 and 4).

Preparation Example 6 of Recording Layer (B)

The coating solution prepared in Preparation Example 1 of Recording Layer (B) was applied on one surface of a polyethylene terephthalate film having a thickness of 12 μm (manufactured by Toyobo Co., Ltd., trade name: ESPET FILM E5100) with a gravure coater so as to be a solid content after drying of 2 g/m². After drying in an oven at 70° C. for 30 seconds, curing was further performed at 40° C. for 8 hours to obtain a film having a recording layer (B).

TABLE 3

|  | Raw material used | Recording layer (B) blend ratio (in terms of solid/% by weight) | | | | |
|---|---|---|---|---|---|---|
|  |  | Preparation Example 1 | Preparation Example 2 | Preparation Example 3 | Preparation Example 4 | Preparation Example 5 |
| Polymer having anti-static function | Polymer having antistatic function obtained in Preparation Example 1 of Polymer Having Antistatic Function (lithium concentration in solid content: 0.6 wt %) | 10 | 40 | — | — | — |
|  | Polymer having antistatic function obtained in Preparation Example 2 of Polymer Having Antistatic Function (quaternary ammonium salt-type copolymer) | — | — | 20 | 5 | — |
| Polymer binder | Polymer binder obtained in Preparation Example 1 of Polymer Binder | 42 | 55 | — | — | 52 |
|  | Polymer binder obtained in Preparation Example 2 of Polymer Binder | — | — | — | 75 | — |
|  | Polymer binder obtained in Preparation Example 3 of Polymer Binder | — | — | 40 | 10 | — |
|  | Polyamide-epichlorohydrin resin solution (manufactured by Seiko PMC Corporation, trade name: WS4024) | — | — | 40 | 10 | — |
| Pigment particles | Precipitating silica (manufactured by Mizusawa industrial Chemicals, Ltd., trade name: MIZUKASIL P-527, average particle size: 1.6 μm, oil absorption: 180 cc/100 g) | 30 | — | — | — | 30 |
|  | Surface treated barium sulfate (manufactured by Sakai Chemical Industry, Co., Ltd., trade name: BARIACE B-32, average particle size: 0.3 μm) | 15 | — | — | — | 15 |
| Curing agent | Hexamethylene diisocyanate (manufactured by Nippon Polyurethane Industry, Co., Ltd., trade name: COLONATE HL) | 3 | 5 | — | — | 3 |
|  | Solid concentration of coating solution for recording layer (B) (wt %) | 20 | 20 | 3 | 20 | 20 |

Production Examples A to E, K, and L of Label Layer (i)

The coating solution obtained in each of Preparation Examples 1 to 5 of Recording Layer (B) was applied on one surface of the resin film layer (A) obtained in each of the above Production Examples 1 to 6 of Resin Film Layer (A) with a bar coater so as to be the combination and thickness shown in Table 4. After drying in an oven at 70° C. for 30 seconds, curing was further performed at 40° C. for 8 hours to obtain a label layer (i).

Production Example F of Label Layer (i)

An adhesive agent (manufactured by Toyo-Morton, Ltd., a mixed solution of equivalent amount of trade name: TM-329 and trade name: CAT-18B) was applied on one surface of the resin film layer (A) obtained in the above Production Example 1 of Resin Film Layer (A) so as to be a solid content of 3 g/m$^2$ and a thickness after drying of 3 μm. After drying at 40° C. for 1 minute, the film having the recording layer (B) obtained in Preparation Example 6 of Recording Layer (B) was attached so that the recording layer (B) came to the outer side to obtain a label layer (i).

Production Example G of Label Layer (i)

The coating solution obtained in Preparation Example 3 of Recording Layer (B) was applied on both surfaces of the resin film layer (A) obtained in the above Production Example 1 of Resin Film Layer (A) with a squeeze coater so as to be a coated amount after drying of 0.05 g/m$^2$ and a thickness after drying of 0.05 μm. After drying in an oven at 70° C. for 30 seconds, curing was further performed at 40° C. for 8 hours to provide a recording layer (B). Then, an adhesive agent (manufactured by Toyo-Morton, Ltd., a mixed solution of equivalent amount of trade name: TM-329 and trade name: CAT-18B) was further applied on the recording layer (B) that is one surface of the resin film layer (A) so as to be a solid content of 3 g/m$^2$ and a thickness after drying of 3 μm. After drying at 40° C. for 1 minute, the resin film layer (A) obtained in Production Example 7 of Resin Film Layer (A) was attached to obtain a label layer (i).

Production Example H of Label Layer (i)

The coating solution obtained in Preparation Example 4 of Recording Layer (B) was applied on both surfaces of the resin film layer (A) obtained in the above Production Example 2 of Resin Film Layer (A) with a squeeze coater so as to be a coated amount after drying of 0.1 g/m$^2$ and a thickness after drying of 0.1 μm. After drying in an oven at 70° C. for 30 seconds, curing was further performed at 40° C. for 8 hours to provide a recording layer (B). Then, an adhesive agent (manufactured by Toyo-Morton, Ltd., a mixed solution of equivalent amount of trade name: TM-329 and trade name: CAT-18B) was further applied on the recording layer (B) that is one surface of the resin film layer (A) so as to be a solid content of 3 g/m$^2$ and a thickness after drying of 3 μm. After drying at 40° C. for 1 minute, the resin film layer (A) obtained in Production Example 7 of Resin Film Layer (A) was attached to obtain a label layer (i).

Production Examples J and M of Label Layer (i)

Each of the resin film layers (A) obtained in Production Examples 1 and 8 of Resin Film Layer (A) was used as a label layer (i) as it was. The resin film layers (A) did not have recording layers (B) but the surface-treated surfaces were used in Comparative Examples and Test Examples to be mentioned later as surfaces for recording layer sides.

Production Examples N to R and W of Label Layer (i)

The coating solution obtained in each of Preparation Examples 1 to 5 of Recording Layer (B) was applied on one surface of the resin film layer (A) obtained in each of the above Production Examples 9 and 11 to 14 of Resin Film Layer (A) with a bar coater so as to be the combination and thickness shown in Table 5. After drying in an oven at 70° C. for 30 seconds, curing was further performed at 40° C. for 8 hours to obtain a label layer (i).

Production Example S of Label Layer (i)

An adhesive agent (manufactured by Toyo-Morton, Ltd., a mixed solution of equivalent amount of trade name: TM-329 and trade name: CAT-18B) was applied on one surface of the resin film layer (A) obtained in the above Production Example 9 of Resin Film Layer (A) so as to be a solid content of 3 g/m$^2$ and a thickness after drying of 3 μm. After drying at 40° C. for 1 minute, the film having the recording layer (B) obtained in Preparation Example 6 of Recording Layer (B) was attached so that the recording layer (B) came to the outer side to obtain a label layer (i).

[Production Example T of Label Layer (i)]

The coating solution obtained in Preparation Example 3 of Recording Layer (B) was applied on both surfaces of the resin film layer (A) obtained in the above Production Example 9 of Resin Film Layer (A) with a squeeze coater so as to be a coated amount after drying of 0.05 g/m$^2$ and a thickness after drying of 0.05 μm. After drying in an oven at 70° C. for 30 seconds, curing was further performed at 40° C. for 8 hours to provide a recording layer (B). Then, an adhesive agent (manufactured by Toyo-Morton, Ltd., a mixed solution of equivalent amount of trade name: TM-329 and trade name: CAT-18B) was further applied on the recording layer (B) that is one surface of the resin film layer (A) so as to be a solid content of 3 g/m$^2$ and a thickness after drying of 3 μm. After drying at 40° C. for 1 minute, the resin film layer (A) obtained in Production Example 10 of Resin Film Layer (A) was attached to obtain a label layer (i).

Production Example U of Label Layer (i)

The coating solution obtained in Preparation Example 4 of Recording Layer (B) was applied on both surfaces of the resin film layer (A) obtained in the above Production Example 12 of Resin Film Layer (A) with a squeeze coater so as to be a coated amount after drying of 0.1 g/m$^2$ and a thickness after drying of 0.1 μm. After drying in an oven at 70° C. for 30 seconds, curing was further performed at 40° C. for 8 hours to provide a recording layer (B). Then, an adhesive agent (manufactured by Toyo-Morton, Ltd., a mixed solution of equivalent amount of trade name: TM-329 and trade name: CAT-18B) was further applied on the recording layer (B) that is one surface of the resin film layer (A) so as to be a solid content of 3 g/m$^2$ and a thickness after drying of 3 μm. After drying at 40° C. for 1 minute, the resin film layer (A) obtained in Production Example 10 of Resin Film Layer (A) was attached to obtain a label layer (i).

Production Examples V and X of Label Layer (i)

Each of the resin film layer (A) obtained in Production Examples 9 and 15 of Resin Film Layer (A) was used as a label layer (i) as it was. The resin film layers (A) did not have recording layers (B) but the surface-treated surfaces were used in Comparative Examples and Test Examples to be mentioned later as surfaces for recording layer sides.

The physical properties of the label layers (i) obtained in individual Production Examples are shown collectively in Tables 4 and 5.

TABLE 4

| Production Example of Label Layer (i) | Constitution of label layer (i) | | Thickness (μm) | | | Opacity (%) | Gurley stiffness (mgf) | | Surface resistivity (Ω) | | Water vapor permeation coefficient of label layer (i) (g · mm/m$^2$ · 24 hr) |
|---|---|---|---|---|---|---|---|---|---|---|---|
| | Resin film layer (A) | Recording layer (B) | Layer (i) | Layer (A) | Layer (B) | | MD | TD | Layer (A) side | Layer (B) side | |
| Production Example A | Production Example 1 | Preparation Example 1 | 42 | 40 | 2 | 62 | 5.8 | 11.9 | $6 \times 10^{14}$ | $5 \times 10^{12}$ | 0.30 |
| Production Example B | Production Example 2 | Preparation Example 2 | 51 | 50 | 1 | 79.2 | 8.2 | 16.7 | $1 \times 10^{15}$ | $9 \times 10^{11}$ | 0.34 |
| Production Example C | Production Example 3 | Preparation Example 3 | 80.05 | 80 | 0.05 | 91.5 | 28.9 | 59.2 | $3 \times 10^{15}$ | $4 \times 10^{8}$ | 0.51 |
| Production Example D | Production Example 4 | Preparation Example 4 | 60.2 | 60 | 0.2 | 51.3 | 21.7 | 46.8 | $9 \times 10^{14}$ | $2 \times 10^{9}$ | 0.32 |
| Production Example E | Production Example 5 | Preparation Example 1 | 143 | 140 | 3 | 96 | 173.1 | 288.3 | $1 \times 10^{15}$ | $2 \times 10^{12}$ | 0.30 |
| Production Example F | Production Example 1 | Preparation Example 6 | 57 | 40 + 3 + 12 | 2 | 66 | 13.3 | 27.4 | $6 \times 10^{14}$ | $5 \times 10^{12}$ | 0.35 |
| Production Example G | Production Examples 1 + 7 | Preparation Example 3 | 63.1 | 40 + 0.05 + 3 + 20 | 0.05 | 63.5 | 16.2 | 34.1 | $4 \times 10^{15}$ | $1 \times 10^{9}$ | 0.27 |
| Production Example H | Production Examples 2 + 7 | Preparation Example 4 | 73.2 | 50 + 0.1 + 3 + 20 | 0.1 | 79.8 | 24.6 | 51.6 | $2 \times 10^{15}$ | $1 \times 10^{10}$ | 0.24 |
| Production Example J | Production Example 1 | none | 40 | 40 | — | 60 | 5.5 | 11.6 | $2 \times 10^{15}$ | $2 \times 10^{15}$ | 0.29 |
| Production Example K | Production Example 2 | Preparation Example 5 | 53 | 50 | 3 | 80.6 | 8.4 | 17.2 | $1 \times 10^{15}$ | $4 \times 10^{15}$ | 0.33 |
| Production Example L | Production Example 6 | Preparation Example 2 | 81 | 80 | 1 | 94.1 | 12.6 | 27.7 | $1 \times 10^{15}$ | $5 \times 10^{11}$ | 8.95 |
| Production Example M | Production Example 8 | none | 40 | 40 | — | 0.2 | 6.9 | 13.8 | $2 \times 10^{15}$ | $4 \times 10^{15}$ | 0.15 |

TABLE 5

| Production Example of Label Layer (i) | Constitution of label layer (i) | | Thickness (μm) | | | Opacity (%) | Gurley stiffness (mgf) | | Surface resistivity (Ω) | | Water vapor permeation coefficient of label layer (i) (g · mm/m$^2$ · 24 hr) |
|---|---|---|---|---|---|---|---|---|---|---|---|
| | Resin film layer (A) | Recording layer (B) | Layer (i) | Layer (A) | Layer (B) | | MD | TD | Layer (A) side | Layer (B) side | |
| Production Example N | Production Example 9 | Preparation Example 1 | 42 | 40 | 2 | 13.2 | 7.1 | 14.4 | $3 \times 10^{15}$ | $2 \times 10^{12}$ | 0.15 |
| Production Example O | Production Example 11 | Preparation Example 3 | 70.05 | 70 | 0.05 | 1.7 | 8.2 | 6.2 | $2 \times 10^{15}$ | $4 \times 10^{9}$ | 0.18 |
| Production Example P | Production Example 12 | Preparation Example 2 | 61 | 60 | 1 | 27.2 | 21.1 | 41.8 | $7 \times 10^{14}$ | $4 \times 10^{11}$ | 0.25 |
| Production Example Q | Production Example 13 | Preparation Example 4 | 80.1 | 80 | 0.1 | 35.6 | 53.9 | 68.1 | $9 \times 10^{14}$ | $5 \times 10^{8}$ | 0.28 |
| Production Example R | Production Example 14 | Preparation Example 1 | 131 | 130 | 1 | 47.8 | 235.9 | 314.5 | $1 \times 10^{15}$ | $6 \times 10^{12}$ | 0.22 |
| Production Example S | Production Example 9 | Preparation Example 6 | 57 | 40 + 3 + 12 | 2 | 15.5 | 14.2 | 29.1 | $2 \times 10^{15}$ | $3 \times 10^{12}$ | 0.16 |
| Production Example T | Production Examples 9 + 10 | Preparation Example 3 | 63.1 | 40 + 0.05 + 3 + 20 | 0.05 | 0.9 | 23.7 | 47.4 | $4 \times 10^{15}$ | $3 \times 10^{9}$ | 0.13 |
| Production Example U | Production Examples 12 + 10 | Preparation Example 4 | 83.1 | 60 + 0.1 + 3 + 20 | 0.1 | 24.6 | 52.7 | 106.7 | $8 \times 10^{14}$ | $2 \times 10^{8}$ | 0.19 |
| Production Example V | Production Example 9 | none | 40 | 40 | — | 0.2 | 6.9 | 13.8 | $2 \times 10^{15}$ | $4 \times 10^{15}$ | 0.15 |
| Production Example W | Production Example 9 | Preparation Example 5 | 42 | 40 | 2 | 13.4 | 7.1 | 14.4 | $2 \times 10^{15}$ | $6 \times 10^{14}$ | 0.15 |
| Production Example X | Production Example 15 | none | 40 | 40 | — | 60 | 5.5 | 11.6 | $2 \times 10^{15}$ | $2 \times 10^{15}$ | 0.29 |

Production Examples I to V of Support Layer (ii)

According to Production Examples described in Table 6, support layers (ii) used in Examples and Comparative Examples of the electrostatic adsorbable sheet (iii) of the present invention were obtained.

The physical properties of the support layers (ii) obtained in individual Production Examples are shown collectively in Table 6.

Example 9

Using an apparatus for producing an electrostatic adsorbable sheet (iii) whose schematic view is shown in FIG. 8, the support layer (ii) obtained in Production Example II was unwound from the roll (41), and a charge injection treatment by direct-current corona discharge was carried out on the inner surface (non-coated surface) of the support layer (ii). As conditions for the charge injection treatment, the distance

TABLE 6

| Production Example of Support Layer (ii) | Content | Thickness μm | Relative dielectric constant | Surface resistance Ω Inner side (surface coming into contact with layer (A)) | Surface resistance Ω Outer side (surface not coming into contact with layer (A)) |
|---|---|---|---|---|---|
| Production Example I | Support layer having conductive layer provided at outer side by applying conductive coating (manufactured by Dainichiseika color& Chemicals Mfg. Co., Ltd., trade name: NEOCON COAT 565DR2) on one surface of biaxially stretched polyethylene terephthalate film (manufactured by Mitsubishi Plastics Inc., trade name: DIAFOIL O300, thickness: 100 μm) so as to be a solid content of 2 g/m² after drying | 102 | 2.9 | $2 \times 10^{14}$ | $3 \times 10^{5}$ |
| Production Example II | Support layer having conductive layer provided at outer side by applying coating prepared in Preparation Example 1 of Recording Layer (B) on corona discharged surface-treated surface of biaxially stretched polypropylene film (manufactured by Futamura Chemical Co., Ltd., trade name: FOP-K, thickness: 50 μm) so as to be a solid content of 2 g/m² after drying | 52 | 2.2 | $3 \times 10^{15}$ | $5 \times 10^{12}$ |
| Production Example III | Support layer obtained by applying polyurethane adhesive agent (manufactured by Toyo-Morton Ltd., mixed solution of equivalent amount of trade name: TM-329 and trade name: CAT-18B) on corona discharged surface-treated surface of biaxially stretched polypropylen film (manufactured by Futamura Chemical Co., Ltd., trade name: FOP-K, thickness: 50 μm) so as to be a solid content of 3 g/m² and, after drying, dry-laminating aluminum-deposited polyethylene terephthalate film (manufactured by Oike & Co., Ltd., trade name: Tetolight PC, thickness: 12 μm) so that the aluminum-deposited surface thereof comes to outer side | 65 | 2.4 | $3 \times 10^{15}$ | $7 \times 10^{-1}$ |
| Production Example IV | Biaxially stretched polyethylene terephthalate film (manufactured by Mitsubishi Plastics Inc., trade name: DIAFOIL O300, thickness: 100 μm) | 100 | 2.9 | $2 \times 10^{14}$ | $3 \times 10^{14}$ |
| Production Example V | High-quality paper (manufactured by Oji Paper Co., Ltd., trade name: Marshmallow, thickness: 126 μm) | 126 | 5.9 | $4 \times 10^{10}$ | $8 \times 10^{10}$ |

Examples 1 to 8 and 10 to 17, Comparative Examples 1 to 11

Using an apparatus for producing an electrostatic adsorbable sheet (iii) whose schematic view is shown in FIG. 8, each of the label layers (i) described in Tables 7 and 8 was unwound from the roll (41), and a charge injection treatment by direct-current corona discharge was carried out on the surface of the resin film layer (A) side of the label layer (i). As conditions for the charge injection treatment, the distance between the wire-shaped electrode (45) and the counter electrode roll (46) in FIG. 8 was set at 1 cm and the discharge voltage of processing conditions described in Tables 7 and 8 was used.

Separately, each of the support layers (ii) described in Tables 7 and 8 was unwound from the roll (42), lamination was performed so that the resin film layer (A) surface of the label layer (i) on which the charge injection treatment had been carried out in the above came into contact with the inner surface (non-coated surface) of the support layer (ii), and the both layers were attached by pressure with the pressure roll (49), thereby obtaining electrostatic adsorbable sheets (iii) of Examples 1 to 8 and 10 to 17, Comparative Examples 1 to 11.

between the wire-shaped electrode (45) and the counter electrode roll (46) in FIG. 8 was set at 1 cm and a discharge voltage of 15 kV was used.

Separately, the label layer (i) obtained in Production Example B was unwound from the roll (42), lamination was performed so that the inner surface (non-coated surface) of the support layer (ii) on which the charge injection treatment had been carried out in the above came into contact with the surface of the resin film layer (A) side of the label layer (i), and the both layers were attached by pressure with the pressure roll (49), thereby obtaining an electrostatic adsorbable sheet (iii) of Example 9.

Example 18

Using an apparatus for producing an electrostatic adsorbable sheet (iii) whose schematic view is shown in FIG. 8, the support layer (ii) obtained in Production Example II was unwound from the roll (41), and a charge injection treatment by direct-current corona discharge was carried out on the inner surface (non-coated surface) of the support layer (ii). As conditions for the charge injection treatment, the distance between the wire-shaped electrode (45) and the counter electrode roll (46) in FIG. 8 was set at 1 cm and a discharge voltage of 15 kV was used.

Separately, the label layer (i) obtained in Production Example N was unwound from the roll (42), lamination was performed so that the inner surface (non-coated surface) of the support layer (ii) on which the charge injection treatment had been carried out in the above came into contact with the surface of the resin film layer (A) side of the label layer (i), and the both layers were attached by pressure with the pressure roll (49), thereby obtaining an electrostatic adsorbable sheet (iii) of Example 18.

The combination of the label layer (i) and the support layer (ii) and the discharge voltage of charge injection treatment used in Examples 1 to 18 and Comparative Examples 1 to 11 of the present invention, and the evaluation results based on the following Test Examples are shown collectively in Tables 7 and 8.

TABLE 7

| | | Constitution of electrostatic absorbable sheet (iii) | | Processing conditions | Evaluation item | | | | |
|---|---|---|---|---|---|---|---|---|---|
| | | | | | Ink adhesiveness | | | Adsorability | |
| | | | | Discharge | Adhesion | | | | |
| | | Label layer (i) | Support layer (ii) | voltage kV | Evaluation | strength kg-cm | Paper alignment | Evaluation | Adsorption force g/m² |
| Example | Example 1 | Production Example A | Production Example I | 12 | ○ | 2.2 | ○ | ○ | 12,000 |
| | Example 2 | Production Example B | Production Example II | 15 | ○ | 1.8 | ○ | ○ | 8,500 |
| | Example 3 | Production Example C | Production Example I | 17 | ○ | 1.5 | ○ | ○ | 13,500 |
| | Example 4 | Production Example D | Production Example I | 17 | ○ | 3.1 | ○ | ○ | 9,000 |
| | Example 5 | Production Example E | Production Example III | 25 | ○ | 1.6 | ○ | ○ | 7,000 |
| | Example 6 | Production Example F | Production Example III | 15 | ○ | 2.5 | ○ | ○ | 9,000 |
| | Example 7 | Production Example G | Production Example I | 20 | ○ | 2.1 | ○ | ○ | 10,500 |
| | Example 8 | Production Example H | Production Example II | 22 | ○ | 1.9 | ○ | ○ | 9,500 |
| | Example 9 | Production Example B | Production Example II | 15 | ○ | 1.8 | ○ | ○ | 6,000 |
| Comparative Example | Comparative Example 1 | Production Example J | Production Example I | 12 | × | 1.2 | × | ○ | 30,000 |
| | Comparative Example 2 | Production Example K | Production Example I | 15 | ○ | 1.9 | × | ○ | 24,500 |
| | Comparative Example 3 | Production Example L | Production Example I | 13 | × | 1.2 | ○ | × | 200 |
| | Comparative Example 4 | Production Example M | Production Example I | 13 | × | 1.1 | × | ○ | 26,500 |
| | Comparative Example 5 | Production Example A | Production Example IV | 12 | ○ | 2.2 | × | ○ | 13,000 |
| | Comparative Example 6 | Production Example A | Production Example V | 12 | ○ | 2.2 | ○ | Δ | 1,200 |

TABLE 8

| | | Constitution of electrostatic absorbable sheet (iii) | | Processing conditions | Evaluation item | | | | | |
|---|---|---|---|---|---|---|---|---|---|---|
| | | | | | Ink adhesiveness | | | Adsorability | | |
| | | | | Discharge | Adhesion | | | | | |
| | | Label layer (i) | Support layer (ii) | voltage kV | Evaluation | strength kg-cm | Paper alignment | Evaluation | Adsorption force g/m² | Visibility of label layer (i) |
| Example | Example 10 | Production Example N | Production Example I | 13 | ○ | 3.3 | ○ | ○ | 9,500 | ○ |
| | Example 11 | Production Example O | Production Example II | 18 | ○ | 2.5 | ○ | ○ | 12,000 | ○ |
| | Example 12 | Production Example P | Production Example III | 15 | ○ | 3.7 | ○ | ○ | 8,000 | ○ |
| | Example 13 | Production Example Q | Production Example II | 20 | ○ | 3.2 | ○ | ○ | 13,500 | ○ |
| | Example 14 | Production Example R | Production Example II | 27 | ○ | 4.5 | ○ | ○ | 6,500 | ○ |
| | Example 15 | Production Example S | Production Example II | 15 | ○ | 2.7 | ○ | ○ | 7,500 | ○ |
| | Example 16 | Production Example T | Production Example I | 15 | ○ | 2.7 | ○ | ○ | 9,000 | ○ |

TABLE 8-continued

|  |  | Constitution of electrostatic absorbable sheet (iii) | | Processing conditions | Evaluation item | | | | | |
|---|---|---|---|---|---|---|---|---|---|---|
|  |  |  |  |  | Ink adhesiveness | | | Adsorbability | | |
|  |  |  |  | Discharge | | Adhesion | | | Adsorption | Visibility |
|  |  | Label layer (i) | Support layer (ii) | voltage kV | Evaluation | strength kg·cm | Paper alignment | Evaluation | force g/m² | of label layer (i) |
|  | Example 17 | Production Example U | Production Example I | 19 | ○ | 2.9 | ○ | ○ | 7,000 | ○ |
|  | Example 18 | Production Example N | Production Example II | 15 | ○ | 3.3 | ○ | ○ | 7,000 | ○ |
| Comparative Example | Comparative Example 7 | Production Example V | Production Example I | 13 | x | 1.1 | x | ○ | 26,500 | ○ |
|  | Comparative Example 8 | Production Example W | Production Example I | 13 | ○ | 3.3 | x | ○ | 31,000 | ○ |
|  | Comparative Example 9 | Production Example X | Production Example I | 12 | x | 1.2 | x | ○ | 30,000 | x |
|  | Comparative Example 10 | Production Example N | Production Example IV | 13 | ○ | 3.3 | x | ○ | 11,000 | ○ |
|  | Comparative Example 11 | Production Example N | Production Example V | 13 | ○ | 3.3 | ○ | Δ | 1,400 | ○ |

Test Examples (Ink Adhesiveness)

The electrostatic adsorbable sheet (iii) was stored in an atmosphere at a temperature of 23° C. and at a relative humidity of 50% for 1 day. Thereafter, using a print tester (manufactured by Akari Seisakusho, trade name: RI-III Model Printability Tester), the electrostatic adsorbable sheet (iii) was homogeneously printed on the recording layer (B) thereof with a printing ink (manufactured by T&K TOKA, trade name: Bestcure 161 (black)) so as to be a thickness of 1.5 g/m². The printing ink was dried and solidified by performing irradiation with UV under a metal halide lamp (manufactured by Eye Graphics, output: 80 W/cm) so as to be a UV radiation intensity of 0.04 W/cm².

After the electrostatic adsorbable sheet (iii) was again stored in an atmosphere at a temperature of 23° C. and at a relative humidity of 50% for 1 day, a cellophane tape (manufactured by NICHIBAN CO., LTD., trade name: CT-18) was attached to the printed surface. Using "Internal Bond Tester" (manufactured by Kumagai Riki Kogyo, trade name), the ink peeling strength was measured in accordance with JAPAN TAPPI No. 18-2 (internal bonding strength testing method) and an average value of results of the measurement performed twice was taken as adhesion strength. From the results, evaluation was performed according to the following criteria.

○: Passed The adhesion strength is 1.4 kg·cm or more.

x: Not passed The adhesion strength is less than 1.4 kg·cm.

(Paper Alignment)

The electrostatic adsorbable sheet (iii) was blanked out with a blanking blade to a size of 89 mm length×57 mm width, and 100 cards of the type were prepared. The thus-prepared cards were randomly spread on a glass plate having a size of 1 m×1 m. The cards were collected with hand to form a bundle of 100 cards and evaluation was performed as to whether or not they could be bundled in good order, according to the following criteria.

○: Good A bundle in which for edges were aligned well could be foamed.

Δ: Slightly good A bundle could be formed though their four edges were not aligned.

x: Not good The cards attached to the glass plate and it was difficult to form a bundle.

(Adsorption Force)

Figure 9:
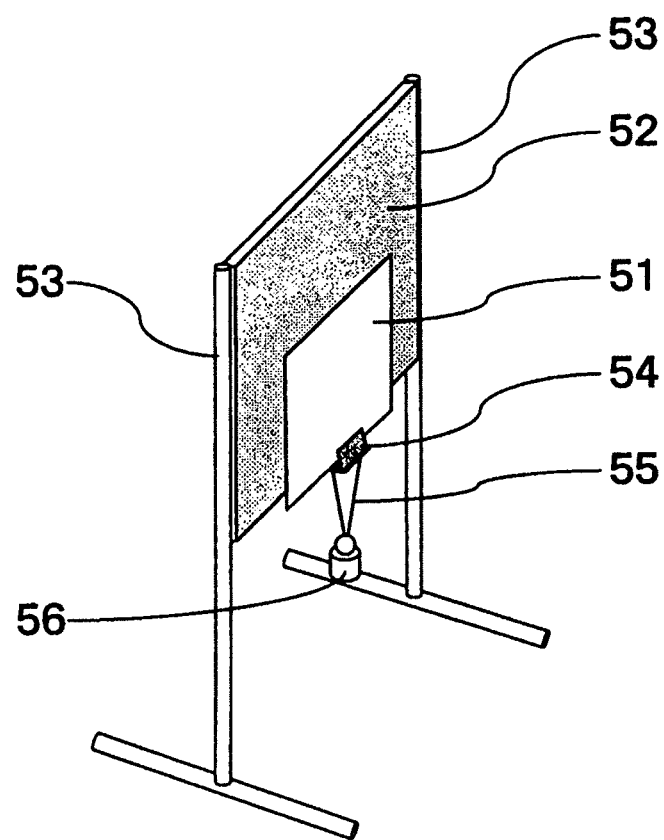
FIG. 9 It is a schematic view of an adsorbability measurement apparatus used in Examples of the present invention.

The electrostatic adsorbable sheet (iii) was cut to a size of 200 mm×220 mm and stored in an atmosphere at a relative humidity of 50% for 1 day. Thereafter, the label layer (i) was peeled away from the electrostatic adsorbable sheet (iii) in the same atmosphere and attached on a glass plate of an adsorption force measurement apparatus whose schematic view is shown in FIG. 9 so that the adsorption area was 200 mm×200 mm and an width of 20 mm from the lower end of the label layer (i) stuck out. Then, a clip was attached to the lower end portion, a weight of 10 g to which a string had been attached was added thereto one by one, and adsorption force was determined from the weight of the weights at the time when the label layer (i) slipped off, with converting the weight into a value per square meter. Evaluation was performed according to the following criteria.

○: Good The adsorption force was 5,000 g/m² or more.

Δ: Slightly good The adsorption force was 1,000 g/m² or more and less than 5,000 g/m².

x: Not good The adsorption force was less than 1,000 g/m².

(Visibility Through Object to be Attached)

For Examples 10 to 18 and Comparative Examples 7 to 11, visibility through the object to be attached was also evaluated as follows.

The electrostatic adsorbable sheet (iii) was cut to a size of 200 mm×220 mm and an arbitrary letter was written on the surface of the recording layer (B) with a felt-tip pen. After the sheet was stored in an atmosphere at a relative humidity of 50% for 1 day, using the adsorption force measurement apparatus above, it was confirmed whether the letter could be read from the opposite (non-attached surface) side of the same glass plate when the label layer (i) was attached on a glass plate. As a result, the written letter could be read except for the case of the label layer (i) of Comparative Example 9.

As is apparent from the above results, since the electrostatic adsorbable sheet (iii) of the present invention has a small surface resistivity of its front and back surfaces, the electrostatic adsorbability is not exhibited externally before display use, troubles such as blocking of sheets themselves hardly occur, handlability is good, and the ink adhesiveness is excellent, so that the sheet is compatible with a variety of printing methods.

Also, the electrostatic adsorbability is sufficiently high at the time when the label layer (i) is used for display. Since this is derived from the charges introduced into the inside of the resin film in the label layer (i), the electrostatic adsorbability is hardly influenced by humidity and thus durability is enough. Therefore, the layer can be used for display over a long period of time and also the label layer (i) can be easily peeled away after use.

Accordingly, the electrostatic adsorbable sheet (iii) of the present invention is very useful as a seal, a label, a sign, a poster, an advertisement, and the like since a printed material thereof can be display with attaching it to an object to be attached. When the label layer (i) is opaque, the undertone of the object to be attached is not seen through, and the print can be clearly visually observed. On the other hand, in the case where the label layer (i) is transparent or translucent, when attached to an object to be attached such as glass, the print can be clearly visually observed through it.

While the present invention has been described in detail and with reference to specific embodiments thereof, it will be apparent to one skilled in the art that various changes and modifications can be made therein without departing from the spirit and scope thereof.

The present application is based on Japanese Patent Application No. 2010-285648 filed on Dec. 22, 2010 and Japanese Patent Application No. 2010-285652 filed on Dec. 22, 2010, and the contents are incorporated herein by reference.

Industrial Applicability

Since the electrostatic adsorbable sheet (iii) of the present invention enables displaying of the label layer (i) with attaching it to an object to be attached by electrostatic adsorption and has a sufficiently high electrostatic adsorbability and a sufficient durability over a long period of time, the sheet can be widely used as a seal, a label, a sign, a poster, an advertisement, and the like. Moreover, since the electrostatic adsorbable sheet (iii) of the present invention does not exhibit the electrostatic adsorbability externally before display use, troubles such as blocking of sheets themselves hardly occur, handlability is good, and the ink adhesiveness is excellent, so that the sheet is compatible with a variety of printing methods.

Description of Reference Numerals and Signs 1, 11, 21 Electrostatic adsorbable sheet (iii)
2, 12, 22 Label layer (i)
3, 13, 23 Support layer (ii)
a Adhering surface by electrostatic adsorption
4, 14, 24, 25 Resin film layer (A)
5, 15, 26 Recording layer (B)
16 Film layer for forming recording layer (B)
17, 27 Adhesive layer
31 Electrostatic adsorbable sheet (iii)
32 High-voltage direct-current power source (manufactured by Matsusada Precision)
33 Needle-shaped applied electrode
34 Counter electrode
35 Wire-shaped electrode
36 Needle-shaped electrode
37 Counter electrode roll
38 Wire-shaped electrode
41 Label layer (i) (or support layer (ii))
42 Support layer (ii) (or label layer (i))
43 Electrostatic adsorbable sheet (iii)
44 High-voltage direct-current power source (manufactured by Matsusada Precision)
45 Wire-shaped electrode
46 Counter electrode (roll)
47 Guide roll (ground connection)
48 Nip roll
49 Nip roll (bonding roll)
51 Label layer (i)
52 Glass plate
53 Supporting pole
54 Clip
55 Fishing line
56 Weight

The invention claimed is:

1. An electrostatic adsorbable sheet (iii) which is a laminate comprising: a label layer (i) containing a resin film layer (A) and a recording layer (B) on one surface of the resin film layer (A); and a support layer (ii), wherein at least one of the label layer (i) and the support layer (ii) is subjected to an electrically charging treatment, the resin film layer (A) and the support layer (ii) are electrostatically adsorbed, the surface resistivity of the label layer (i) side is from $1\times10^{-1}\Omega$ to $9\times10^{12}\Omega$, and the surface resistivity of the support layer (ii) side is from $1\times10^{-1}\Omega$ to $9\times10^{12}\Omega$, wherein the electrically charging treatment is a direct-current corona discharge treatment.

2. The electrostatic adsorbable sheet (iii) as claimed in claim 1, wherein the label layer (i) is subjected to an electrically charging treatment.

3. The electrostatic adsorbable sheet (iii) as claimed in claim 1, wherein the support layer (ii) is subjected to an electrically charging treatment.

4. The electrostatic adsorbable sheet (iii) as claimed in claim 1, wherein the surface resistivity of the surface of the resin film layer (A) side of the label layer (i) is from $1\times10^{13}\Omega$ to $9\times10^{17}\Omega$, and the surface resistivity of the surface of the support layer (ii), which comes into contact with the resin film layer (A), is from $1\times10^{13}\Omega$ to $9\times10^{17}\Omega$.

5. The electrostatic adsorbable sheet (iii) as claimed in claim 1, wherein the resin film layer (A) contains a thermoplastic resin.

6. The electrostatic adsorbable sheet (iii) as claimed in claim 5, wherein the thermoplastic resin in the resin film layer (A) contains a polyolefin resin.

7. The electrostatic adsorbable sheet (iii) as claimed in claim 1, wherein the resin film layer (A) contains a stretched resin film layer stretched in at least one axial direction.

8. The electrostatic adsorbable sheet (iii) as claimed in claim 1, wherein the resin film layer (A) has a porosity of from 5 to 60%.

9. The electrostatic adsorbable sheet (iii) as claimed in claim 1, wherein the resin film layer (A) has a porosity of 0% or more and less than 5%.

10. The electrostatic adsorbable sheet (iii) as claimed in claim 1, wherein the recording layer (B) contains a polymer having an antistatic function.

11. The electrostatic adsorbable sheet (iii) as claimed in claim 10, wherein the polymer having an antistatic function in the recording layer (B) contains at least one of a quaternary ammonium salt-type copolymer and an alkali metal salt-containing polymer.

12. The electrostatic adsorbable sheet (iii) as claimed in claim 1, wherein the recording layer (B) contains an alkali metal ion in an amount of from 0.01 to 1% by weight.

13. The electrostatic adsorbable sheet (iii) as claimed in claim 12, wherein the alkali metal ion in the recording layer (B) contains a lithium ion.

14. The electrostatic adsorbable sheet (iii) as claimed in claim 1, wherein the Gurley stiffness of the label layer (i) is from 5 to 1,000 mgf.

15. The electrostatic adsorbable sheet (iii) as claimed in claim 1, wherein the water vapor permeation coefficient of the label layer (i) is from 0.01 to 2.50 g·mm/(m²·24 hr).

16. The electrostatic adsorbable sheet (iii) as claimed in claim 1, wherein the support layer (ii) contains a thermoplastic resin.

17. The electrostatic adsorbable sheet (iii) as claimed in claim 1, wherein the relative dielectric constant of the support layer (ii) is from 1.1 to 5.0.

18. The electrostatic adsorbable sheet (iii) as claimed in claim 1, wherein the thickness of the label layer (i) is from 20 to 500 μm, and the thickness of the support layer (ii) is from 20 to 500 μm.

19. The electrostatic adsorbable sheet (iii) as claimed in claim 1, wherein the opacity of the label layer (i) is from 50 to 100%.

20. The electrostatic adsorbable sheet (iii) as claimed in claim 1, wherein the opacity of the label layer (i) is 0% or more and less than 50%.

21. A recorded material obtained by printing on the surface of the recording layer (B) side of the electrostatic adsorbable sheet (iii) as claimed in claim 1.

22. A display material comprising the label layer (i) which is obtained by peeling the support layer (ii) from the recorded material as claimed in claim 21.

\* \* \* \* \*